US012707737B2

(12) United States Patent
Baba et al.

(10) Patent No.: US 12,707,737 B2
(45) Date of Patent: Aug. 11, 2026

(54) PHOTODETECTION DEVICE WITH FIRST AND SECOND SUBSTRATES

(71) Applicant: SONY SEMICONDUCTOR SOLUTIONS CORPORATION, Kanagawa (JP)

(72) Inventors: Koichi Baba, Kanagawa (JP); Taiichiro Watanabe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 365 days.

(21) Appl. No.: 18/551,269

(22) PCT Filed: Mar. 15, 2022

(86) PCT No.: PCT/JP2022/011636
§ 371 (c)(1),
(2) Date: Sep. 19, 2023

(87) PCT Pub. No.: WO2022/209856
PCT Pub. Date: Oct. 6, 2022

(65) Prior Publication Data

US 2024/0178245 A1 May 30, 2024

(30) Foreign Application Priority Data

Mar. 30, 2021 (JP) ................................. 2021-057293
Feb. 9, 2022 (WO) .................. PCT/JP2022/005074

(51) Int. Cl.
*H10F 39/00* (2025.01)
*H04N 25/77* (2023.01)
*H10F 39/18* (2025.01)

(52) U.S. Cl.
CPC ......... *H10F 39/8037* (2025.01); *H04N 25/77* (2023.01); *H10F 39/802* (2025.01); *H10F 39/18* (2025.01)

(58) Field of Classification Search
CPC .... H10F 39/8037; H10F 39/18; H10F 39/807; H04N 25/77
(Continued)

(56) References Cited

U.S. PATENT DOCUMENTS

2018/0358393 A1 12/2018 Sato et al.
2020/0027909 A1* 1/2020 Ebiko .................... G01S 17/10
(Continued)

FOREIGN PATENT DOCUMENTS

JP 2009-014459 1/2009
JP 2018-093052 6/2018
(Continued)

OTHER PUBLICATIONS

International Search Report and Written Opinion prepared by the Japan Patent Office on Jun. 7, 2022, for International Application No. PCT/JP2022/011636, 2 pgs.
(Continued)

*Primary Examiner* — Phuc T Dang
(74) *Attorney, Agent, or Firm* — SHERIDAN ROSS P.C.

(57) ABSTRACT

A photodetection that alleviates restrictions on a pixel layout in each pixel and capable of being miniaturized is provided. A photodetection device as provided includes a first substrate including a first semiconductor layer with a first surface and a second surface on a side opposite to the first surface, first and second charge accumulation sections provided on the first surface side, a first photoelectric conversion section in the first semiconductor layer, and first and second voltage application sections that apply a voltage to the first semiconductor layer between the first and second charge accumulation sections and the first photoelectric conversion section, and a second substrate including a second semiconductor layer with a third surface and a fourth surface on a side opposite to the third surface and is bonded (Continued)

to the first substrate, and a first pixel transistor on the third or fourth surface that outputs a pixel signal.

24 Claims, 18 Drawing Sheets

(58) Field of Classification Search
USPC .......................................................... 257/431
See application file for complete search history.

(56) References Cited

U.S. PATENT DOCUMENTS

| | | | |
|---|---|---|---|
| 2020/0083297 | A1 | 3/2020 | Joel et al. |
| 2021/0270941 | A1 | 9/2021 | Watanabe et al. |

FOREIGN PATENT DOCUMENTS

| | | | | | |
|---|---|---|---|---|---|
| JP | 2019-004001 | | | 1/2019 | |
| JP | 2020-013909 | | | 1/2020 | |
| WO | WO-2018180577 | A1 | * | 10/2018 | H05B 33/12 |
| WO | WO 2020/017345 | | | 1/2020 | |
| WO | WO-2020017345 | A1 | * | 1/2020 | H04N 25/70 |

OTHER PUBLICATIONS

Keita et al., "Time-of-Flight Camera," Journal of the Institute of Image Information and Television Engineers, vol. 70, No. 6, 2016, pp. 880-885.

* cited by examiner

FIG. 3

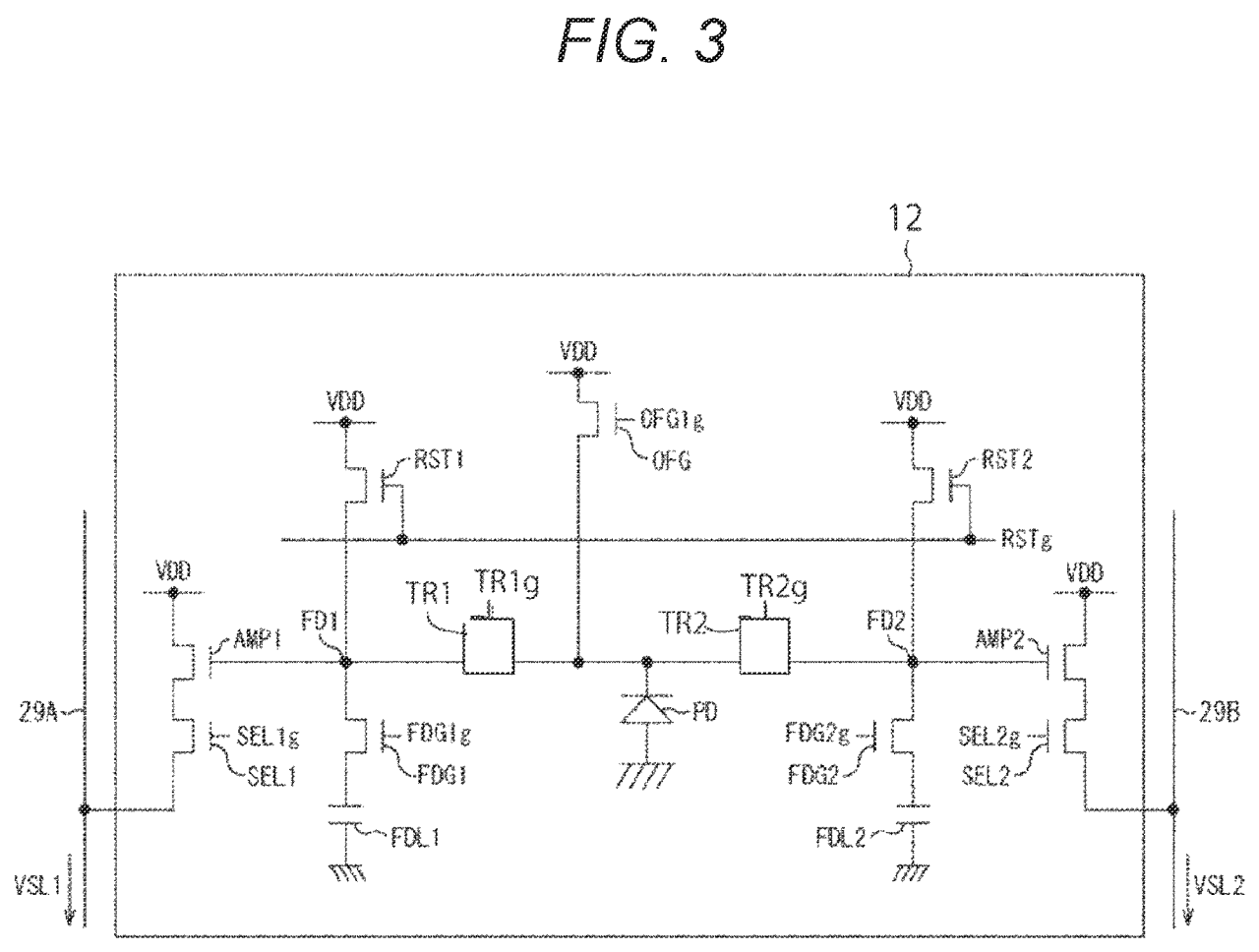

12
29A
29B
VSL1
VSL2
VDD
AMP1
SEL1g
SEL1
FD1
RST1
FDG1g
FDG1
FDL1
TR1
TR1g
OFG1g
OFG
PD
TR2
TR2g
FD2
RST2
RSTg
FDG2g
FDG2
FDL2
AMP2
SEL2g
SEL2

FIG. 9

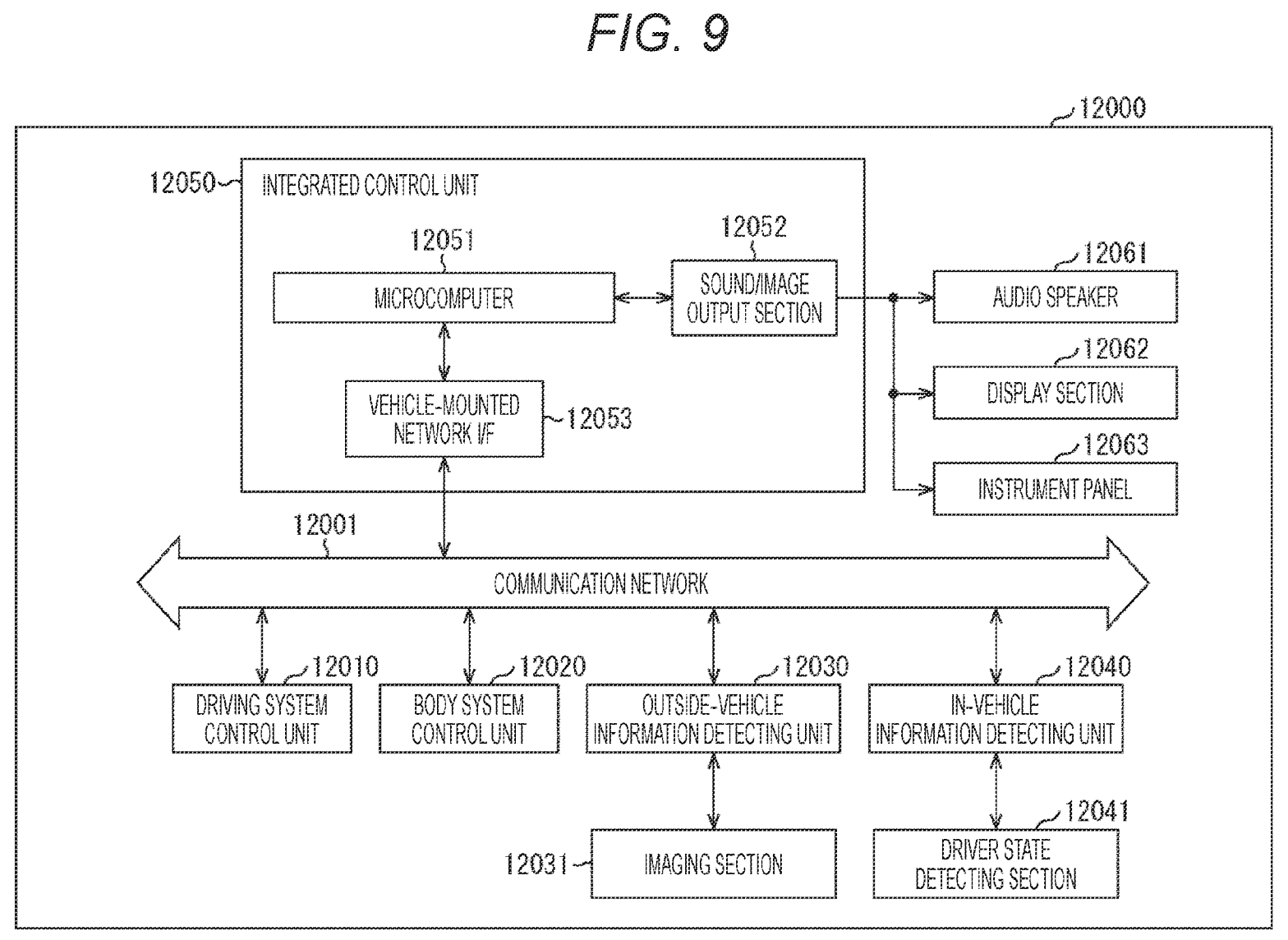

12000
12050
INTEGRATED CONTROL UNIT
12051
MICROCOMPUTER
12052
SOUND/IMAGE OUTPUT SECTION
12053
VEHICLE-MOUNTED NETWORK I/F
12061
AUDIO SPEAKER
12062
DISPLAY SECTION
12063
INSTRUMENT PANEL
12001
COMMUNICATION NETWORK
12010
DRIVING SYSTEM CONTROL UNIT
12020
BODY SYSTEM CONTROL UNIT
12030
OUTSIDE-VEHICLE INFORMATION DETECTING UNIT
12031
IMAGING SECTION
12040
IN-VEHICLE INFORMATION DETECTING UNIT
12041
DRIVER STATE DETECTING SECTION

*FIG. 11*
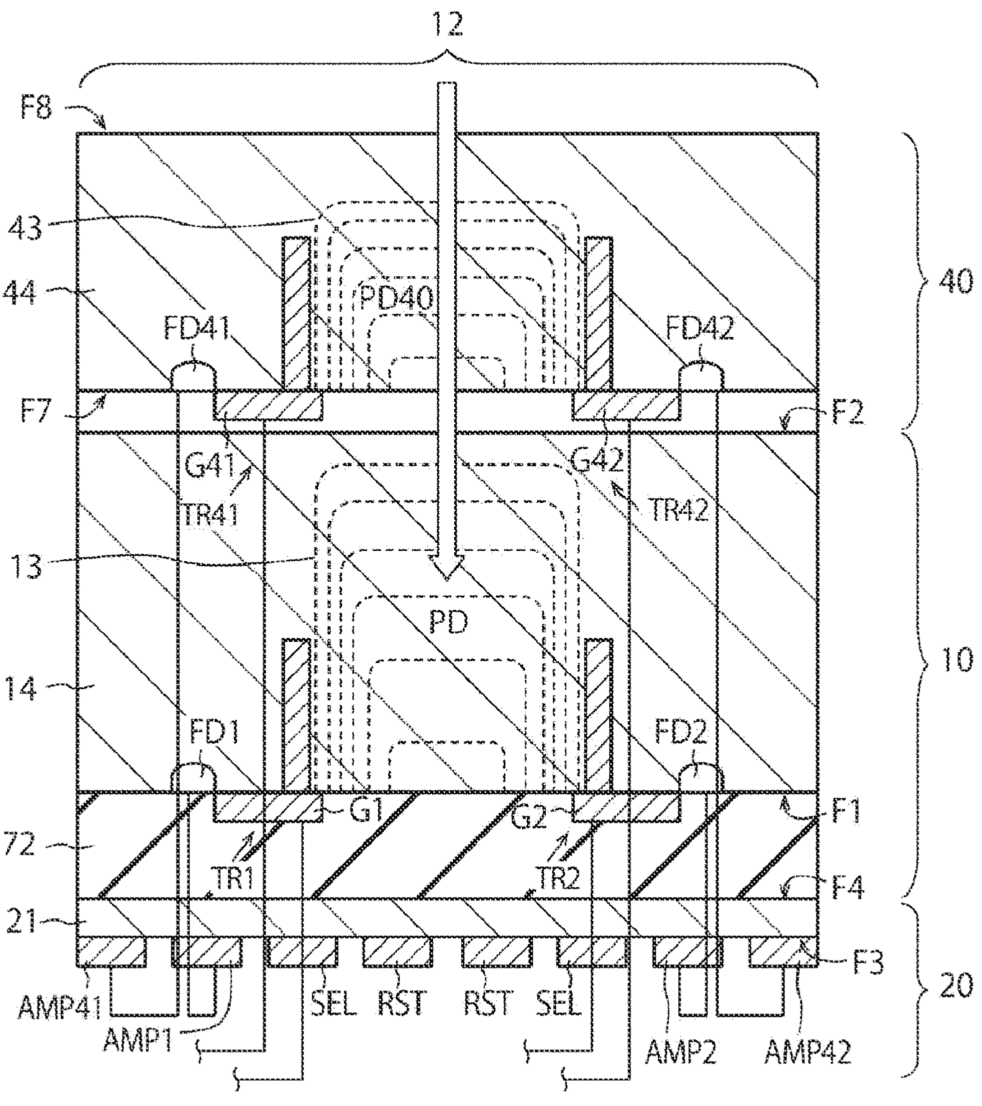
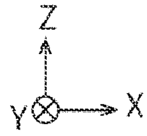

FIG. 16
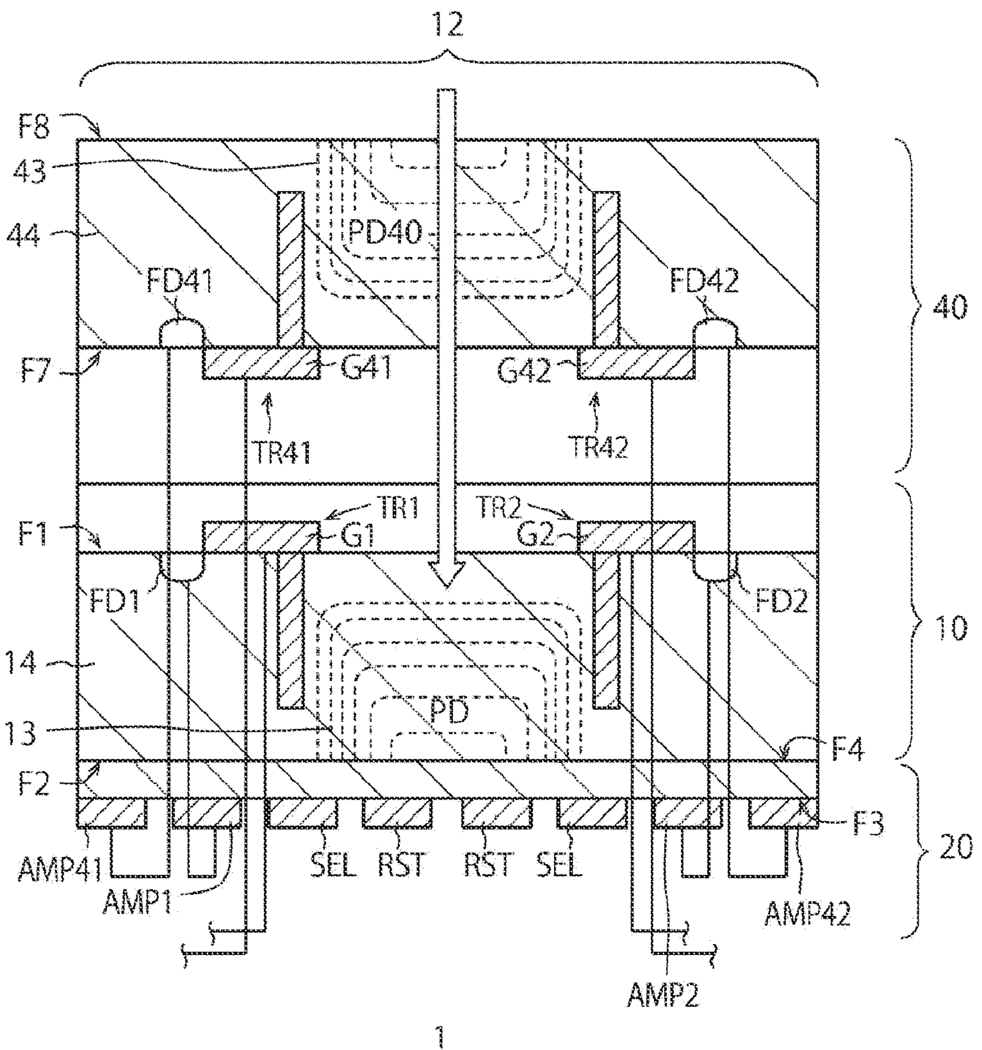
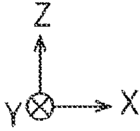

FIG. 17
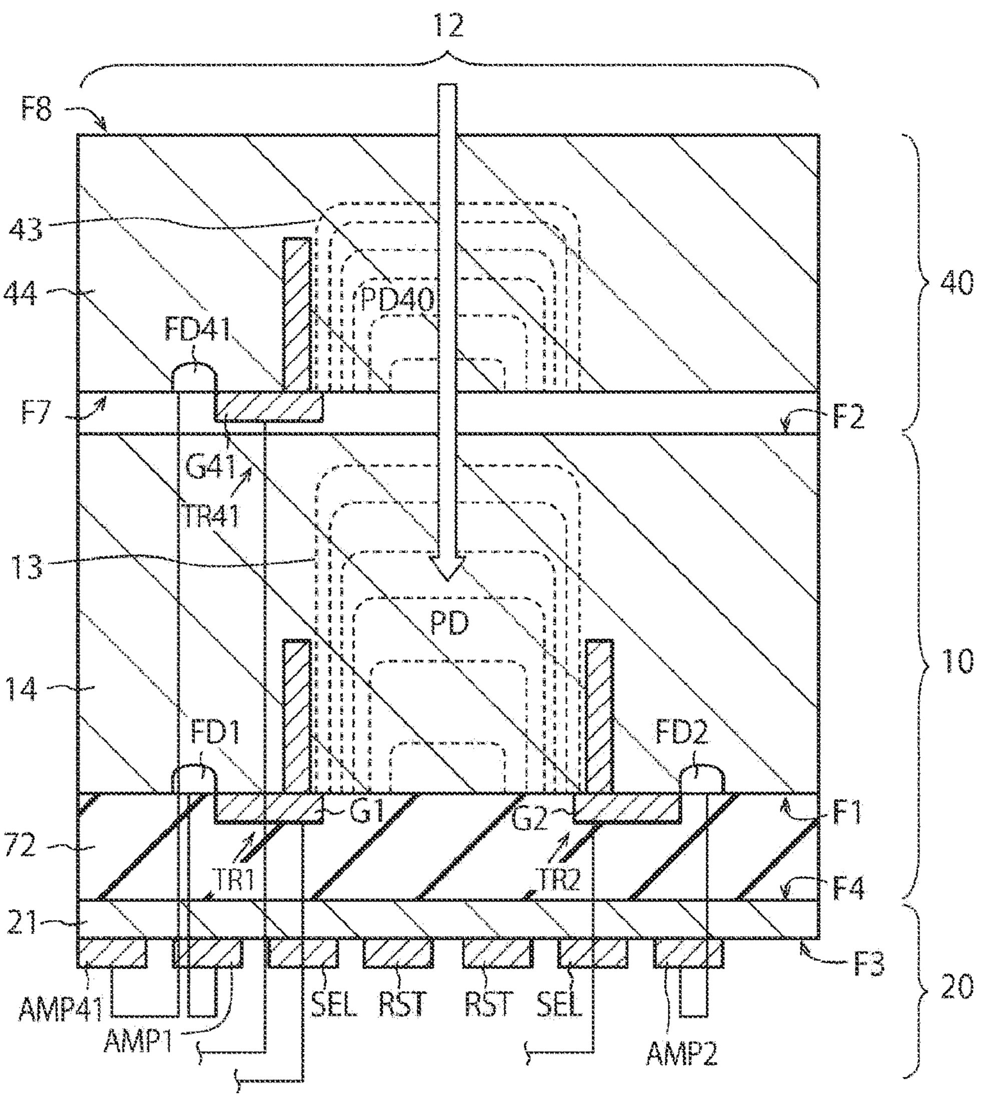
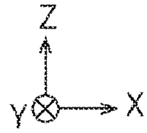
1

*FIG. 18*
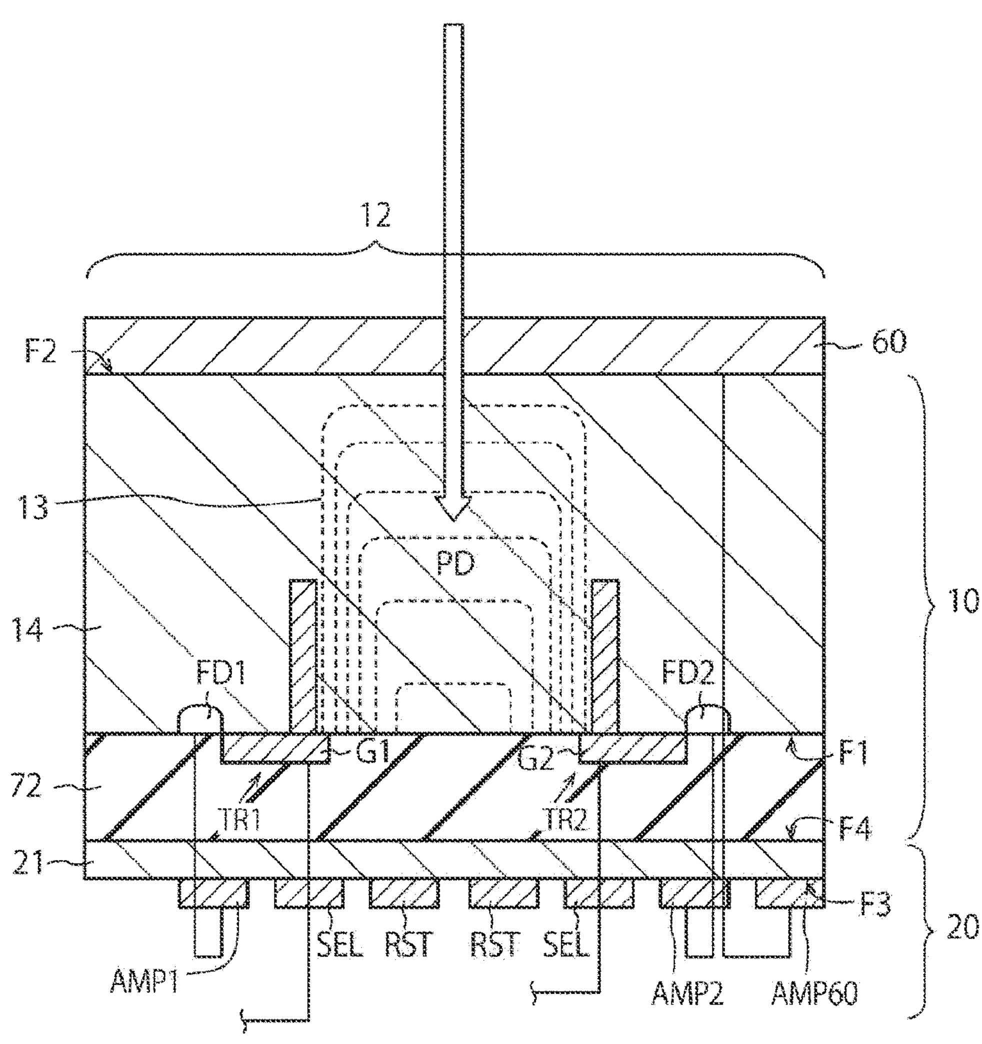
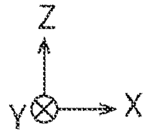

*FIG. 19*
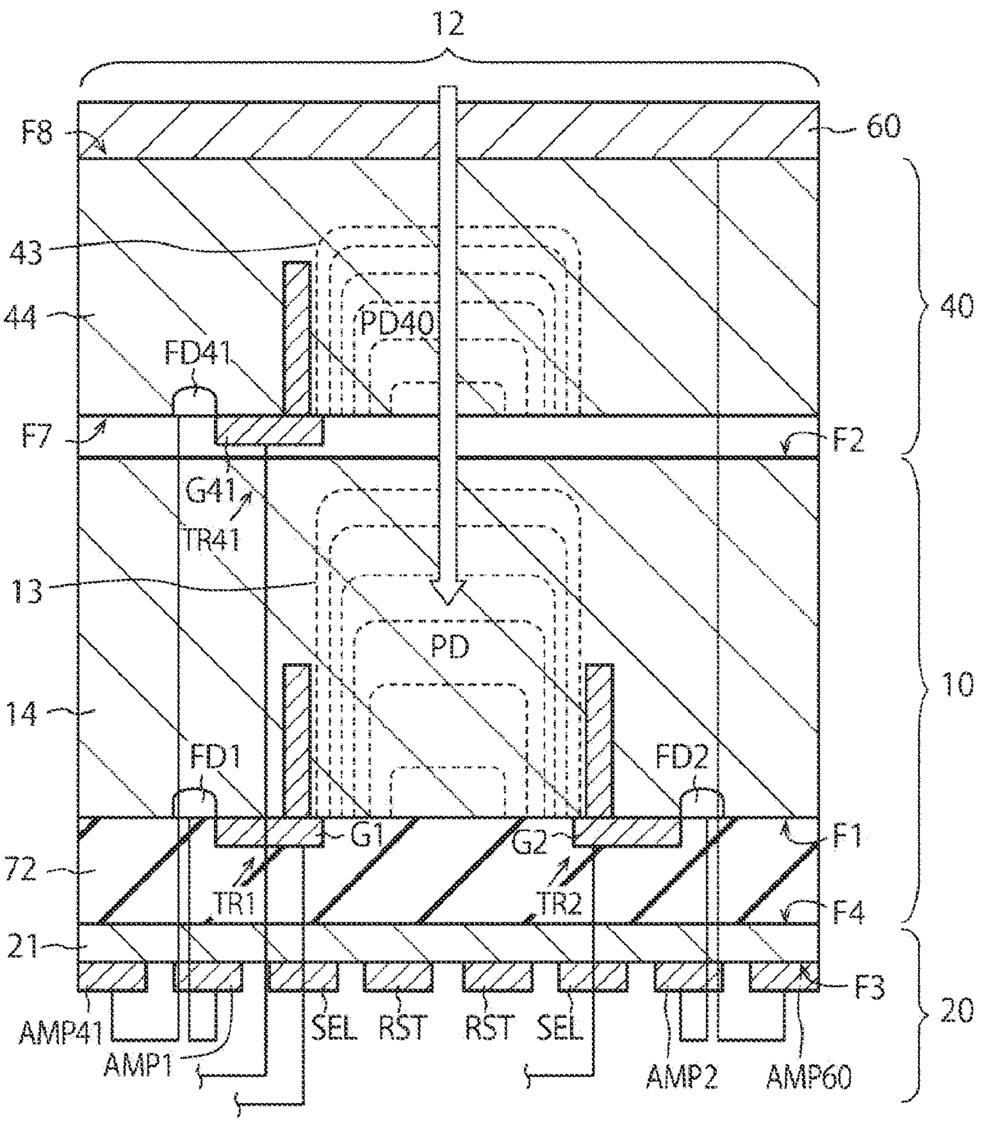
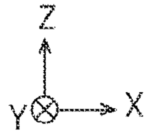

PHOTODETECTION DEVICE WITH FIRST AND SECOND SUBSTRATES

CROSS REFERENCE TO RELATED APPLICATIONS

This application is a national stage application under 35 U.S.C. 371 and claims the benefit of PCT Application No. PCT/JP2022/011636, having an international filing date of 15 Mar. 2022, which designated the United States, which PCT application claimed the benefit of Japanese Patent Application No. 2021-057293, filed 30 Mar. 2021, and PCT Application No. PCT/JP2022/005074, filed 9 Feb. 2022, the entire disclosures of each of which are incorporated herein by reference.

TECHNICAL FIELD

The present disclosure relates to a photodetection device.

BACKGROUND ART

A distance measuring device using an indirect time of flight (iToF) method has been developed. The distance measuring device of the iToF method indirectly calculates the distance from the distance measuring device to a target on the basis of a phase difference between irradiation light and reflected light.

Also in iToF, employment of a global shutter system is desired. The global shutter method is a method in which charges are simultaneously accumulated in all pixels, and then pixel signals from the respective pixels are sequentially read for each pixel row. However, in the global shutter system, a memory for holding charge and a transistor for transferring charge from the memory to the floating diffusion are additionally required in each pixel. Therefore, restrictions on a layout in each pixel become strict, and it becomes difficult to sufficiently secure the areas of photodiodes and memories, or the number of taps cannot be increased. Furthermore, miniaturization of pixels is also hindered.

CITATION LIST

Non-Patent Document

Non-Patent Document 1: Journal of the Institute of Image Information and Television Engineers, Vol. 70 No. 6 (2016), "Time-of-Flight Camera", Keita YASUTOMI, and others

SUMMARY OF THE INVENTION

Problems to be Solved by the Invention

A photodetection device capable of alleviating restrictions on a layout in each pixel and capable of being miniaturized is provided.

Solution to Problems

A photodetection device according to one aspect of the present disclosure includes a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section, and a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section.

The first and second voltage application sections distribute charges generated in the first photoelectric conversion section by reflected light from an object irradiated with irradiation light to the first or second charge accumulation section in synchronization with a period of the irradiation light.

The first pixel transistor includes a first amplification transistor that generates, as the pixel signal, a voltage signal corresponding to a charge retained in the first charge accumulation section, a second amplification transistor that generates, as the pixel signal, a voltage signal corresponding to a charge retained in the second charge accumulation section, a first selection transistor that controls an output timing of the pixel signal from the first amplification transistor, a second selection transistor that controls an output timing of the pixel signal from the second amplification transistor, a first reset transistor that discharges the charge in the first charge accumulation section, and a second reset transistor that discharges the charge in the second charge accumulation section.

The first substrate includes a first transfer transistor that includes a gate electrode as the first voltage application section and transfers the charge generated by the first photoelectric conversion section to the first charge accumulation section, and a second transfer transistor that includes a gate electrode as the second voltage application section and transfers the charge generated by the first photoelectric conversion section to the second charge accumulation section.

The first charge accumulation section is provided around the first voltage application section, the second charge accumulation section is provided around the second voltage application section, the first and second voltage application sections are impurity layers of a first conductivity type, and the first and second charge accumulation sections are impurity layers of a second conductivity type.

The first pixel transistor is provided on the third surface of the second semiconductor layer, and the second substrate is bonded to the first surface of the first substrate on the side of the fourth surface.

For the first and second semiconductor layers, any material of silicon (Si), germanium (Ge), silicon-germanium (SiGe), and indium gallium arsenide (InGaAs) is used.

An electrode plug provided between the first substrate and the second substrate is further provided.

A third substrate bonded to the second substrate and including a logic circuit that processes the pixel signal is further provided.

The first substrate further includes a third charge accumulation section provided on the side of the first surface of the first semiconductor layer, and a third voltage application section that applies a voltage to the first semiconductor layer between the third charge accumulation section and the first photoelectric conversion section.

The first substrate further includes a charge discharge transistor that discharges the charge accumulated in the first photoelectric conversion section.

The first substrate further includes first and second memories connected to the first and second charge holding sections, respectively, and capable of storing charges separately from the first and second charge holding units.

The first substrate further includes a fourth charge accumulation section provided on the side of the first surface of the first semiconductor layer, and a fourth voltage application section that applies a voltage to the first semiconductor layer between the fourth charge accumulation section and the first photoelectric conversion section.

An electronic device according to one aspect of the present disclosure includes a photodetection device that includes a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section, and a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section.

A photodetection device further includes a fourth substrate including a fourth semiconductor layer that includes a seventh surface and an eighth surface on a side opposite to the seventh surface and on a light incident side and is provided on the side of the second surface, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section.

At least a part of the first pixel transistor is shared by the first and second photoelectric conversion sections.

A second amplification transistor that outputs a voltage corresponding to a potential of the second photoelectric conversion section is provided separately from a first amplification transistor that outputs a voltage corresponding to a potential of the first photoelectric conversion section among the first pixel transistors.

The photodetection device further includes a fifth substrate provided between the first substrate and the fourth substrate and including a second pixel transistor that outputs a pixel signal based on a charge output from the second photoelectric conversion section.

The photodetection device further includes a fourth substrate including a fourth semiconductor layer that includes a seventh surface on a light incident side and an eighth surface on a side opposite to the seventh surface, the eighth surface being bonded to the side of the second surface, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section.

The photodetection device further includes a fifth substrate provided on a side of the seventh surface of the fourth substrate and including a second pixel transistor that outputs a pixel signal based on a charge output from the second photoelectric conversion section.

The photodetection device further includes a fourth substrate including a fourth semiconductor layer that includes an eighth surface on a light incident side and a seventh surface on a side opposite to the eighth surface, the seventh surface being bonded to the side of the first surface of the first substrate, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section, in which the second substrate is bonded to the second surface of the first substrate on the side of the fourth surface, and includes, on the third surface, a second pixel transistor that outputs a pixel signal based on a charge output from the second photoelectric conversion section.

One of the pixel signals from the first and fourth substrates is used for distance measurement, and the other is used for obtaining an image.

The photodetection device further includes a photoelectric conversion film provided on the second surface of the first substrate.

The photodetection device further includes a photoelectric conversion film provided on the eighth surface of the fourth substrate.

BRIEF DESCRIPTION OF DRAWINGS

FIG. 3 is a diagram depicting an example of a circuit configuration of a pixel.

FIG. 9 is a block diagram depicting an example of a schematic configuration of a vehicle control system.

FIG. 11 is a cross-sectional view depicting a configuration example of the light receiving element according to a third embodiment.

FIG. 16 is a cross-sectional view depicting a configuration example of the light receiving element according to an eighth embodiment.

FIG. 17 is a cross-sectional view depicting a configuration example of the light receiving element according to a ninth embodiment.

FIG. 18 is a cross-sectional view depicting a configuration example of the light receiving element according to a tenth embodiment.

FIG. 19 is a cross-sectional view depicting a configuration example of the light receiving element according to an eleventh embodiment.

MODE FOR CARRYING OUT THE INVENTION

Figure 1:
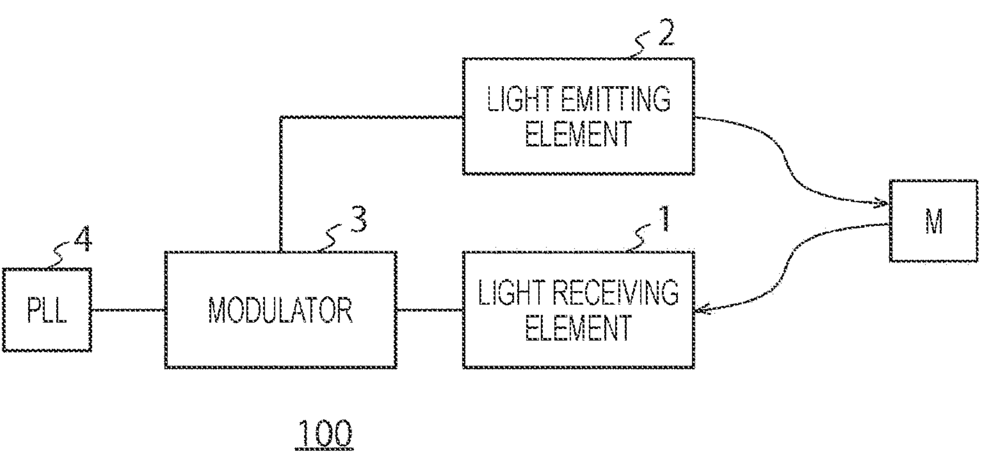
FIG. 1 is a block diagram depicting a configuration example of a distance measuring device according to a first embodiment.

Hereinafter, specific embodiments to which the present technology is applied will be described in detail with reference to the drawings. The drawings are schematic or conceptual, and the ratio of each portion and the like are not necessarily the same as actual ones. In the specification and the drawings, similar elements as those described above with respect to the previously described drawings are denoted by the same reference numerals, and the detailed description thereof is appropriately omitted.

First Embodiment

FIG. 1 is a block diagram depicting a configuration example of a distance measuring device according to a first embodiment. A distance measuring device 100 is a distance measuring device based on an indirect ToF (hereinafter, also referred to as iToF) method, and is used, for example, in an in-vehicle system or the like that is mounted on a vehicle and measures a distance to a target outside the vehicle. In addition, the distance measuring device 100 may also be used in, for example, a system or the like that identifies an individual, such as face authentication.

The distance measuring device 100 includes a light receiving element 1, a light emitting element 2, a modulator 3, and a phase locked loop (PLL) 4. The PLL 4 generates a pulse signal. The modulator 3 modulates the pulse signal from the PLL 4 and generates a control signal. The frequency of the control signal may be, for example, 5 MHz to 20 MHz. The light emitting element 2 emits light in accordance with a control signal from the modulator. The light emitting element 2 includes, as a light source, a light emitting diode that emits light in a range from visible light to infrared light, and generates irradiation light in synchronization with the control signal having a rectangular wave or a sine wave. The light generated by the light emitting element 2 may be, for example, short wave infrared radiometer light (SWIR), or the like. The irradiation light emitted from the light emitting element 2 is reflected by an object M and received by the light receiving element 1.

The reflected light received by the light receiving element 1 is delayed according to the distance to the object M from the timing at which the light emitting element 2 emits light. A delay time of the reflected light with respect to the irradiation light causes a phase difference between the irradiation light and the reflected light. In the iToF method, the distance measuring device 100 calculates the phase difference between the irradiation light and the reflected light, and obtains the distance (depth information) from the distance measuring device 100 to the object M on the basis of the phase difference.

Figure 2:
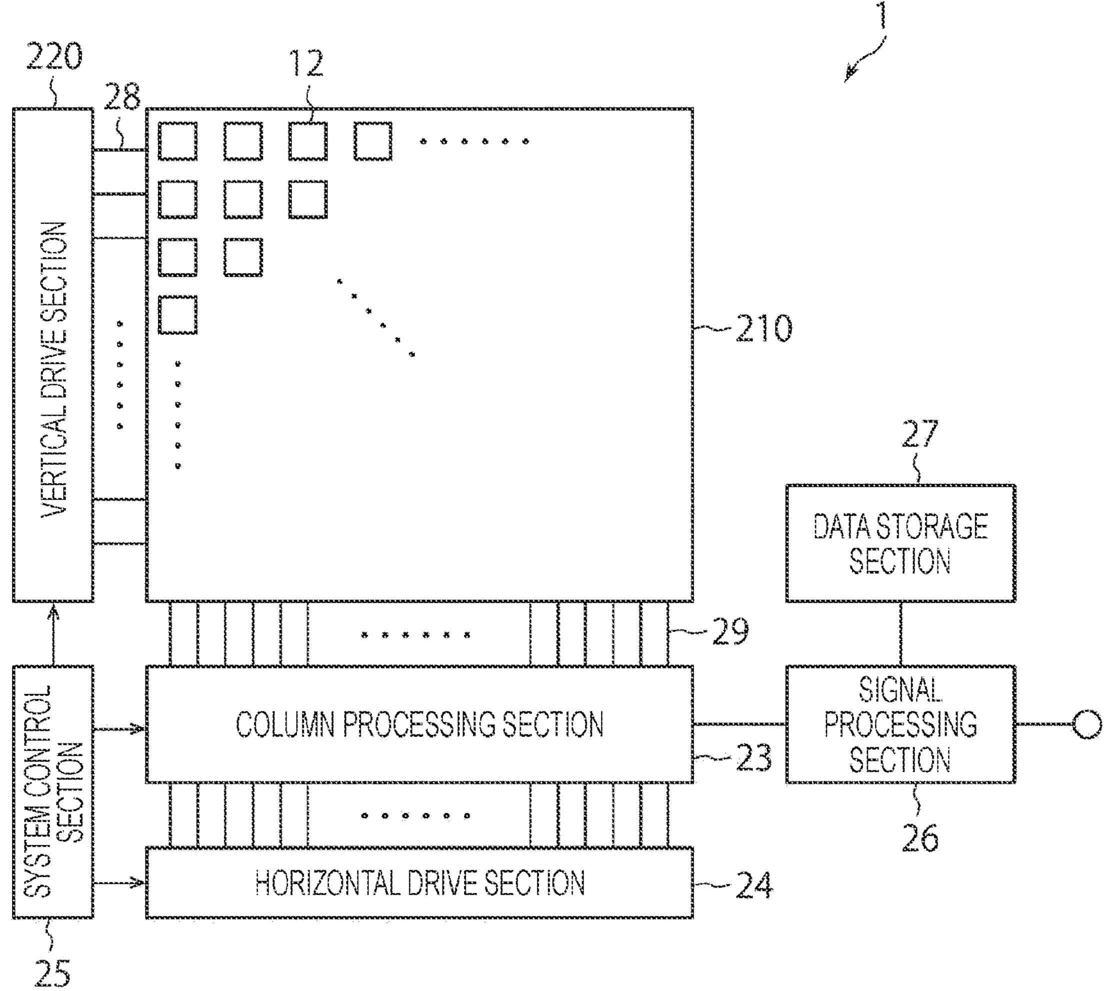
FIG. 2 is a block diagram depicting a schematic configuration example of a light receiving element of the distance measuring device according to the first embodiment.

FIG. 2 is a block diagram depicting a schematic configuration example of the light receiving element of the distance measuring device according to the first embodiment. The light receiving element 1 as a photodetection device is an element used in the distance measuring device 100 by the iToF method in FIG. 1.

The light receiving element 1 receives light (reflected light) returned after irradiation light generated by the light emitting element 2 as a light source strikes the object and is reflected, and outputs a depth image representing distance information to the object as a depth value.

The light receiving element 1 includes a pixel array section 210 and a peripheral circuit section. The peripheral circuit section includes, for example, a vertical drive section 220, a column processing section 23, a horizontal drive section 24, and a system control section 25, as well as a signal processing section 26 and a data storage section 27, and the like.

The pixel array section 210 includes a plurality of pixels 12 two-dimensionally arranged in a matrix in a row direction and a column direction. The pixels 12 generate charges corresponding to an amount of received light, and output pixel signals corresponding to the generated charges. That is, the pixels 12 include a photodiode PD that photoelectrically converts incident light, and output a pixel signal corresponding to the charge obtained as a result of the photoelectric conversion. Details of the pixels 12 will be described later. Note that, in FIG. 2, the row direction is a horizontal direction, and the column direction is a vertical direction.

In the pixel array section 210, a pixel drive line 28 is wired along the row direction for each pixel row and two vertical signal lines 29 are wired along the column direction for each pixel column with respect to a matrix-like pixel array. For example, the pixel drive line 28 transmits a drive signal for performing driving when reading a signal from the pixel 12. Note that, although FIG. 2 indicates the pixel drive line 28 as one wiring line, the pixel drive line 28 is not limited to be constituted by one wiring line. One end of the pixel drive line 28 is connected to an output end corresponding to each row of the vertical drive section 220.

The vertical drive section 220 includes a shift register, an address decoder, and the like, and drives each pixel 12 of the pixel array section 210 at the same time for all pixels or in units of rows. That is, the vertical drive section 220 constitutes a drive section that controls the operation of each pixel 12 of the pixel array section 210 together with the system control section 25 that controls the vertical drive section 220.

The detection signal output from each pixel 12 of the pixel row according to the drive control by the vertical drive section 220 is input to the column processing section 23 through the vertical signal line 29. The column processing section 23 performs predetermined signal processing on the detection signal output from each pixel 12 through the vertical signal line 29, and temporarily holds the detection signal after the signal processing. Specifically, the column processing section 23 performs noise removal processing, analog-to-digital (AD) conversion processing, and the like as signal processing.

The horizontal drive section 24 includes a shift register, an address decoder, and the like, and sequentially selects a unit circuit corresponding to a pixel column of the column processing section 23. By the selective scanning by the horizontal drive section 24, the detection signals subjected to the signal processing for each unit circuit in the column processing section 23 are sequentially output.

The system control section 25 includes a timing generator or the like that generates various timing signals, and performs drive control of the vertical drive section 220, the column processing section 23, the horizontal drive section 24, and the like on the basis of the various timing signals generated by the timing generator.

The signal processing section 26 has an arithmetic processing function, and performs various kinds of signal processing such as arithmetic processing on the basis of the detection signals output from the column processing section 23. The data storage section 27 temporarily stores data necessary for signal processing in the signal processing section 26.

The light receiving element 1 configured as described above adds the distance information regarding the distance to the object to a pixel value as the depth value, and outputs the pixel value as the depth image. The light receiving element 1 can be mounted on, for example, a vehicle-mounted system that is mounted on a vehicle and measures a distance to a target outside the vehicle, or the like.

FIG. 3 is a diagram depicting an example of a circuit configuration of the pixel 12. The pixel 12 includes a photodiode PD, transfer sections TR1 and TR2, floating diffusion regions FD1 and FD2, additional capacitors FDL1 and FDL2, switching transistors FDG1 and FDG2, amplification transistors AMP1 and AMP2, reset transistors RST1 and RST2, selection transistors SEL1 and SEL2, and a charge discharge transistor OFG.

The photodiode PD is a photoelectric conversion element that generates a charge in response to received light.

The switching transistors FDG1 and FDG2, the amplification transistors AMP1 and AMP2, the selection transistors SEL1 and SEL2, the reset transistors RST1 and RST2, and the charge discharge transistor OFG are configured by, for example, n-type metal oxide semiconductor field effect transistors (MOSFETs).

The switching transistor FDG1 is in a conductive state when a switching signal FDG1*g* is in an active state, and connects the additional capacitor FDL1 to the floating diffusion region FD1. The switching transistor FDG2 is in a conductive state when a switching signal FDG2*g* is in an active state, and connects the additional capacitor FDL2 to the floating diffusion region FD2. The additional capacitors FDL1 and FDL2 are only required to include, for example, a capacitive element such as a metal-on-metal (MoM) capacitor, a metal-insulator-metal (MIM) capacitor, or a MOS capacitor. Note that the switching transistors FDG1 and FDG2 are in a conductive state when accumulating charges due to incident light in the iToF, and are electrically connected to the floating diffusion regions FD1 and FD2, respectively. Thus, the pixel 12 can suppress saturation of signal charges in the floating diffusion regions FD1 and FD2, and can accumulate charges.

When a transfer signal TR1*g* applied to a first voltage application section is in an active state (for example, high level), the transfer section TR1 transfers the charge accumulated in the photodiode PD to the floating diffusion region FD1. When a transfer signal TR2*g* applied to the first voltage application section is in an active state, the transfer section TR2 transfers the charge accumulated in the photodiode PD to the floating diffusion region FD2.

Each of the transfer sections TR1 and TR2 is constituted by a metal oxide semiconductor field effect transistor (MOSFET) or an impurity layer. In a case where the transfer sections TR1 and TR2 are constituted by MOSFETs, the first voltage application section is a gate electrode G1 of the transfer section TR1 depicted in FIG. 5, and applies a voltage to the semiconductor substrate 11 between the charge accumulation section FD1 and the photodiode PD. A second voltage application section is a gate electrode G2 of the transfer section TR2, and applies a voltage to the semiconductor substrate 11 between the charge accumulation section FD2 and the photodiode PD. When the transfer signals TR1*g* and TR2*g* applied to the gate electrodes G1 and G2 as voltage application sections are in an active state (for example, high level), each of the MOSFETs of the transfer sections TR1 and TR2 is in a conductive state, and transfers charges from the photodiode PD to the floating diffusion region FD1 or FD2. On the other hand, when the transfer signals TR1*g* and TR2*g* are in an inactive state (for example, low level), the MOSFETs of the transfer sections TR1 and TR2 are in a non-conductive state and do not transfer charges from the photodiode PD.

Figure 6:
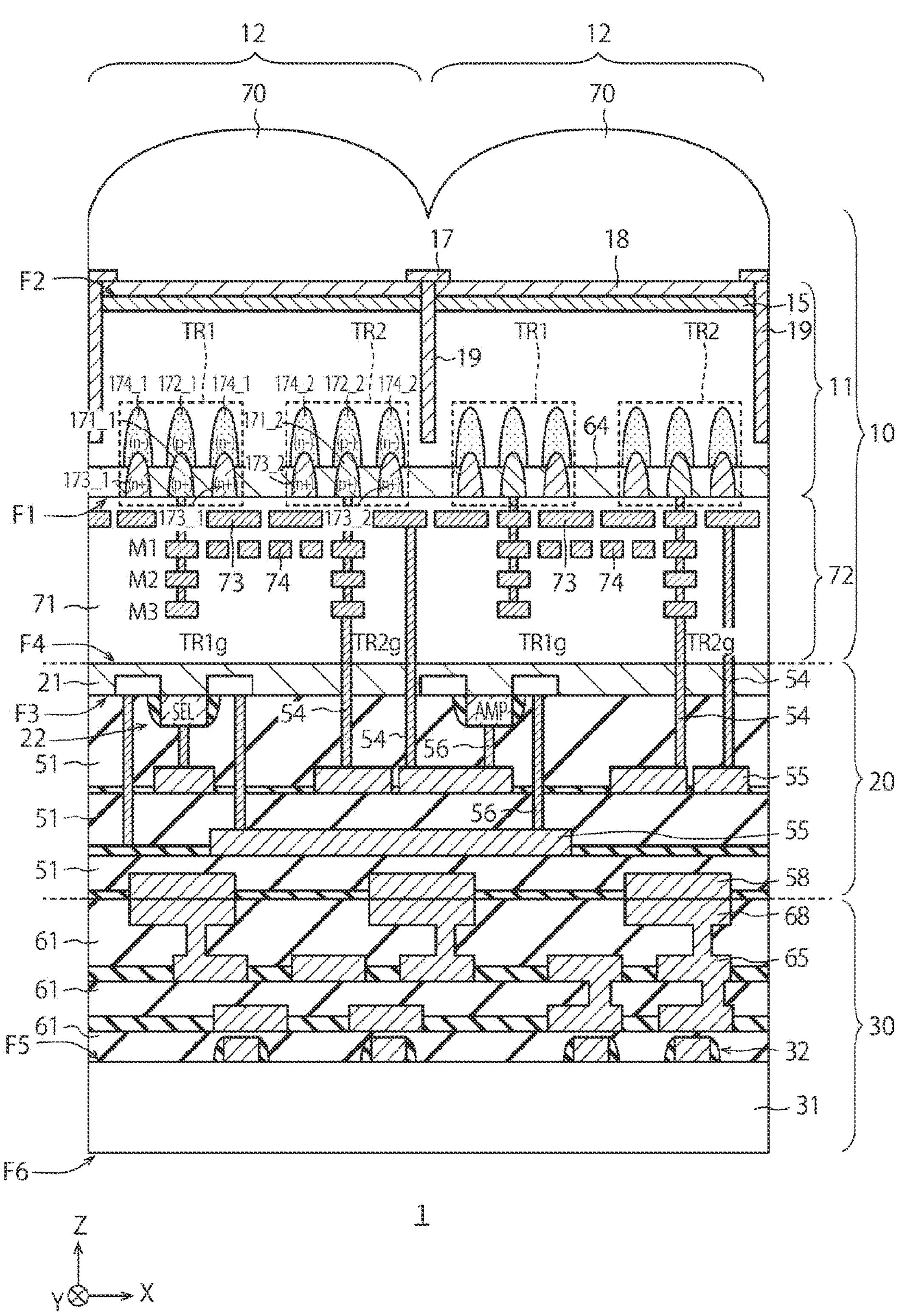
FIG. 6 is a cross-sectional view depicting a configuration example of the light receiving element according to the first embodiment.

In a case where the transfer sections TR1 and TR2 are constituted by impurity layers, the first voltage application section is first conductivity type impurity layers 171_1 and 172_1 (for example, p+ type impurity layers) of the transfer section TR1 depicted in FIG. 6, and forms an electric field in the semiconductor substrate 11 between second conductivity type impurity layers 173_1 and 174_1 as charge accumulation sections and the photodiode PD. The second voltage application section is first conductivity type impurity layers 171_2 and 172_2 (for example, a p+ type impurity layer) of the transfer section TR2, and applies a voltage to the semiconductor substrate 11 between second conductivity type impurity layers 173_2 and 174_2 as charge accumulation sections and the photodiode PD. When the transfer signal TR1*g* or TR2*g* are in an active state (for example, high level), the impurity layers 171_1 and 172_1 or the impurity layers 171_2 and 172_2 are also in an active state (for example, high level). Thus, the impurity layers 171_1 and 172_1 or the impurity layers 171_2 and 172_2 transfer charges from the photodiode PD to the impurity layers 173_1 and 174_1 or the impurity layers 173_2 and 174_2. On the other hand, when the transfer signal TR1*g* or TR2*g* are in an inactive state (for example, low level), the impurity layers 171_1 and 172_1 or the impurity layers 171_2 and 172_2 are also in an inactive state (for example, low level). Thus, the impurity layers 171_1 and 172_1 or the impurity layers 171_2 and 172_2 do not transfer charges from the photodiode PD.

Hereinafter, regardless of whether the transfer sections TR1 and TR2 are constituted by the MOSFETs or the impurity layers, a state in which the charge can be transferred from the photodiode PD is referred to as an "ON state", and a state in which the charge cannot be transferred is referred to as an "OFF state".

A mode in which the transfer sections TR1 and TR2 are constituted by MOSFETs and a mode in which the transfer sections TR1 and TR2 are constituted by impurity layers will be described in more detail later.

When a reset drive signal RST1*g* is in an active state, the reset transistor RST1 is in a conductive state, discharges the charges of the floating diffusion region FD1 and the additional capacitor FDL1, and resets the potentials thereof. When a reset drive signal RST2g is in an active state, the reset transistor RST2 is in a conductive state, discharges the charges of the floating diffusion region FD2 and the additional capacitor FDL2, and resets the potentials thereof. Note that when the reset transistors RST1 and RST2 are in an active state, the transfer sections TR1 and TR2 are also in an active state at the same time, and memories MEM1 and MEM2 are also reset.

For example, in a case where charges due to incident light are accumulated in iToF, the vertical drive section 220 brings the switching transistors FDG1 and FDG2 into a conductive state to connect the floating diffusion region FD1 and the additional capacitor FDL1 and connect the floating diffusion region FD2 and the additional capacitor FDL2. Thus, a large amount of charge can be accumulated.

On the other hand, in a case of increasing the signal-to-noise (SN) ratio, the vertical drive section 220 may bring the switching transistors FDG1 and FDG2 into a non-conductive state, and separate the additional capacitors FDL1 and FDL2 from the floating diffusion regions FD1 and FD2, respectively. By reducing the capacitances of the floating diffusion regions FD1 and FD2, the magnitude (voltage) of the pixel signal obtained by one charge (electron) can be increased. As described above, the dynamic range of the light receiving element 1 can be increased by switching the ON/OFF states of the switching transistors FDG1 and FDG2.

The charge discharge transistor OFG is in a conductive state when a discharge signal OFG1g is in an active state, and discharges the charges accumulated in the photodiode PD.

A source electrode of the amplification transistor AMP1 is connected to a vertical signal line 29A via the selection transistor SEL1. Thus, the amplification transistor AMP1 is connected to a constant-current source (not depicted) to constitute a source follower circuit. The amplification transistor AMP1 outputs a voltage corresponding to the potential of the floating diffusion region FD1 to the vertical signal line 29A as a pixel signal (detection signal VSL1). A source electrode of the amplification transistor AMP2 is connected to a vertical signal line 29B via the selection transistor SEL2. Thus, the amplification transistor AMP2 is connected to the constant-current source (not depicted) to constitute a source follower circuit. The amplification transistor AMP2 outputs a voltage corresponding to the potential of the floating diffusion region FD2 to the vertical signal line 29B as a pixel signal (detection signal VSL2).

The selection transistor SEL1 is connected between the source electrode of the amplification transistor AMP1 and the vertical signal line 29A. The selection transistor SEL1 is in a conductive state when a selection signal SEL1g is in an active state, and outputs the detection signal VSL1 output from the amplification transistor AMP1 to the vertical signal line 29A.

The selection transistor SEL2 is connected between the source electrode of the amplification transistor AMP2 and the vertical signal line 29B. The selection transistor SEL2 is in a conductive state when a selection signal SEL2g is in an active state, and outputs the detection signal VSL2 output from the amplification transistor AMP2 to the vertical signal line 29B.

The transfer sections TR1 and TR2, the switching transistors FDG1 and FDG2, the amplification transistors AMP1 and AMP2, the selection transistors SEL1 and SEL2, and the charge discharge transistor OFG of the pixel 12 are controlled by the vertical drive section 220.

Note that, in a case where charges due to incident light are accumulated in the iToF, the additional capacitors FDL1 and FDL2 are respectively connected to the floating diffusion regions FD1 and FD2 as described above. Therefore, in the pixel 12 of iToF, the switching transistors FDG1 and FDG2 may be omitted.

Next, the operation of the pixel 12 will be briefly described.

First, before light reception is started, a reset operation for resetting charges in the pixels 12 is performed in all the pixels. That is, the charge discharge transistor OFG, the reset transistors RST1 and RST2, and the switching transistors FDG1 and FDG2 are brought into a conductive state to discharge charges accumulated in the photodiode PD, the floating diffusion regions FD1 and FD2, and the additional capacitors FDL1 and FDL2.

After the discharge of accumulated charges, light reception is started.

In the light receiving period, the transfer sections TR1 and TR2 are alternately driven. For example, in the first period, the transfer section TR1 is in an ON state, and the transfer section TR2 is in an OFF state. At this time, a charge generated in the photodiode PD is transferred to the floating diffusion region FD1 and/or the additional capacitor FDL1. In a second period subsequent to the first period, the transfer section TR1 is turned off, and the transfer section TR2 is turned on. In the second period, the charge generated in the photodiode PD is transferred to the floating diffusion region FD2 and/or the additional capacitor FDL2. Thus, the charge generated in the photodiode PD is distributed to and accumulated in the floating diffusion region FD1 and/or the additional capacitor FDL1 and the floating diffusion region FD2 and/or the additional capacitor FDL2.

The first and second periods are periodically and alternately repeated in synchronization with the period of the irradiation light from the light emitting element 2. Thus, the floating diffusion regions FD1 and FD2 and the additional capacitors FDL1 and FDL2 can accumulate charges according to the phase difference between the irradiation light from the light emitting element 2 and the reflected light received by the light receiving element 1. The relationship between the phase difference and the charges accumulated in the floating diffusion regions FD1 and FD2 and the additional capacitors FDL1 and FDL2 will be described later.

Then, when the light receiving period ends, each pixel 12 of the pixel array section 210 is sequentially selected. In the selected pixel 12, the selection transistors SEL1 and SEL2 are turned on. Thus, the charges accumulated in the floating diffusion region FD1 and the additional capacitor FDL1 are output to the column processing section 23 via the vertical signal line 29A as the detection signal VSL1. The charges accumulated in the floating diffusion region FD2 and the additional capacitor FDL2 are output to the column processing section 23 via the vertical signal line 29B as the detection signal VSL2.

When one light receiving operation ends in this manner, the next light receiving operation starting from the reset operation is executed.

The reflected light received by the pixel 12 is delayed corresponding to the distance to the target from the timing at which the light source emits the reflected light. A phase difference occurs between the irradiation light and the reflected light by the delay time corresponding to the distance to the target, and the distribution ratio of the charges accumulated in the additional capacitors FDL1 and FDL2 (or the floating diffusion regions FD1 and FD2) changes. Thus, the phase difference between the irradiation light and the reflected light is calculated by detecting the potentials of the floating diffusion regions FD1 and FD2, and the distance to the object can be obtained on the basis of the phase difference.

Figure 4A:
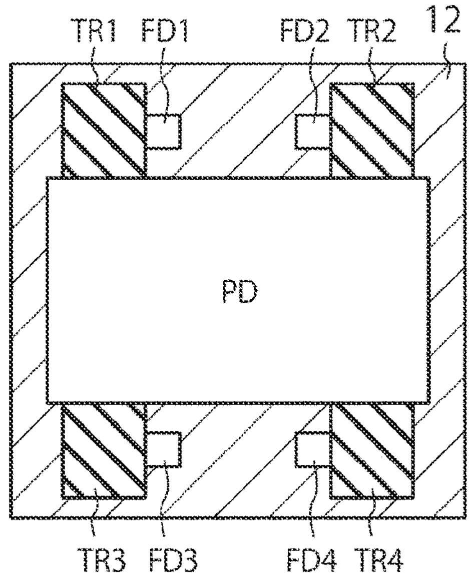
FIGS. 4A and 4B are plan views of a first substrate of the pixel according to the first embodiment.
Figure 4B:
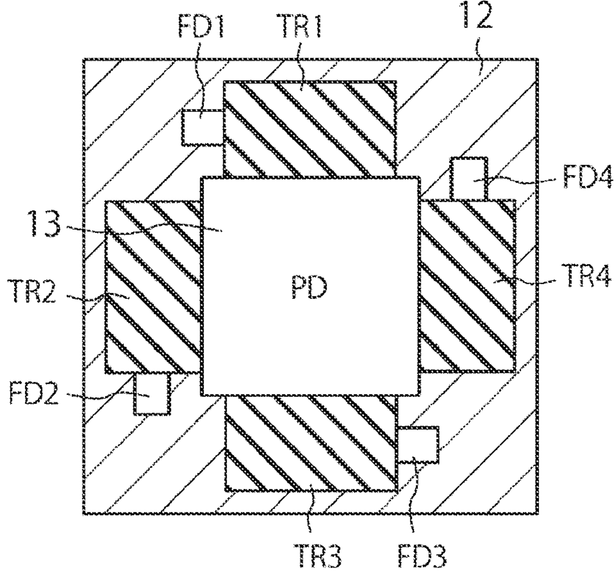

FIGS. 4A and 4B are plan views of a first substrate 10 of the pixel 12 according to the present embodiment. The horizontal direction in FIGS. 4A and 4B corresponds to the row direction (horizontal direction) in FIG. 2, and the vertical direction corresponds to the column direction (vertical direction) in FIG. 2. Note that, hereinafter, the transfer section is also referred to as a tap.

In FIG. 3, one pixel 12 is provided with two taps (TR1 and TR2), but in FIGS. 4A and 4B, one pixel 12 is provided with four taps (TR1 to TR4). Thus, three or more taps may be provided in one pixel 12, and each tap may distribute the charge to the corresponding floating diffusion region. In particular, in a case where the reset transistors, the amplification transistors, and the selection transistors are provided in a second substrate 20 as in the present embodiment, a layout space is generated in the pixel 12 of the first substrate 10. Therefore, as depicted in FIGS. 4A and 4B, four taps may be provided in one pixel 12.

As depicted in FIGS. 4A and 4B, an n-type impurity layer 52 is provided as a photodiode PD. In a plan view as viewed in a Z direction, the photodiode PD has a substantially rectangular outer shape.

In FIG. 4A, the transfer section TR1 and the floating diffusion region FD1 are arranged side by side along a predetermined one side (first side) of four sides of the rectangular pixel 12 outside the photodiode PD. Furthermore, the transfer section TR2 and the floating diffusion region FD2 are arranged side by side along the same first side. A transfer section TR3 and a floating diffusion region FD3 are arranged side by side along the other one of the four sides (the opposite side of the first side) of the rectangular pixel 12. Furthermore, the transfer section TR4 and a floating diffusion region FD4 are arranged side by side along the opposite side of the first side. The depiction of the charge discharge transistor OFG is omitted here.

In FIG. 4B, the transfer section TR1 and the floating diffusion region FD1 are arranged side by side along one side (first side) of four sides of the rectangular pixel 12 outside the photodiode PD. The transfer section TR2 and the floating diffusion region FD2 are arranged side by side along a second side adjacent to the first side of the pixel 12. The transfer section TR3 and the floating diffusion region FD3 are arranged side by side along a third side adjacent to the second side of the pixel 12. Moreover, the transfer section TR4 and the floating diffusion region FD4 are arranged side by side along a fourth side adjacent to the third side of the pixel 12. Also in FIG. 4B, depiction of the charge discharge transistor OFG is omitted.

Here, since the reset transistors RST1 to RST4, the amplification transistors AMP1 to AMP4, and the selection transistors SEL1 to SEL4 (pixel transistors) are provided in the second substrate 20, they are not depicted in FIGS. 4A and 4B. As described above, by arranging the reset transistors RST1 to RST4, the amplification transistors AMP1 to AMP4, and the selection transistors SEL1 to SEL4 in the second substrate 20, a space for increasing taps is generated in the pixel 12 of the first substrate 10. Thus, for example, four taps can be provided in each pixel 12. According to the present embodiment, as depicted in FIG. 4A, it is also possible to increase the number of taps while maintaining a relatively large layout area of the photodiode PD. As depicted in FIG. 4B, the charge transfer capability of the transfer sections TR1 to TR4 may be improved by increasing the number of taps and increasing the layout area of the transfer sections TR1 to TR4. The arrangement is not limited to the arrangement examples of FIGS. 4A and 4B, and other arrangements may be employed.

In addition, although four taps are provided in FIGS. 4A and 4B, the number of taps may be three or less or five or more. For example, in a case where the number of taps is three, it is only required to omit the floating diffusion region FD4 and the transfer section TR4 depicted in FIG. 4A or 4B. Similarly to the floating diffusion regions FD1 and FD2, the floating diffusion region FD3 is provided on a first surface F1 side of the semiconductor substrate 11. Similarly to the transfer sections TR1 and TR2, the transfer section TR3 includes a voltage application section that is provided on the semiconductor substrate 11 between the floating diffusion region FD3 and the photoelectric conversion section PD and applies a voltage to the semiconductor substrate 11. Accordingly, three pixel transistors such as the reset transistors RST1 to RST3, the amplification transistors AMP1 to AMP3, and the selection transistors SEL1 to SEL3 are also provided in the second substrate 20. Thus, each pixel 1 may have three taps.

(In a Case where the Transfer Sections TR1 and TR2 are of a Gate Type)

Figure 5:
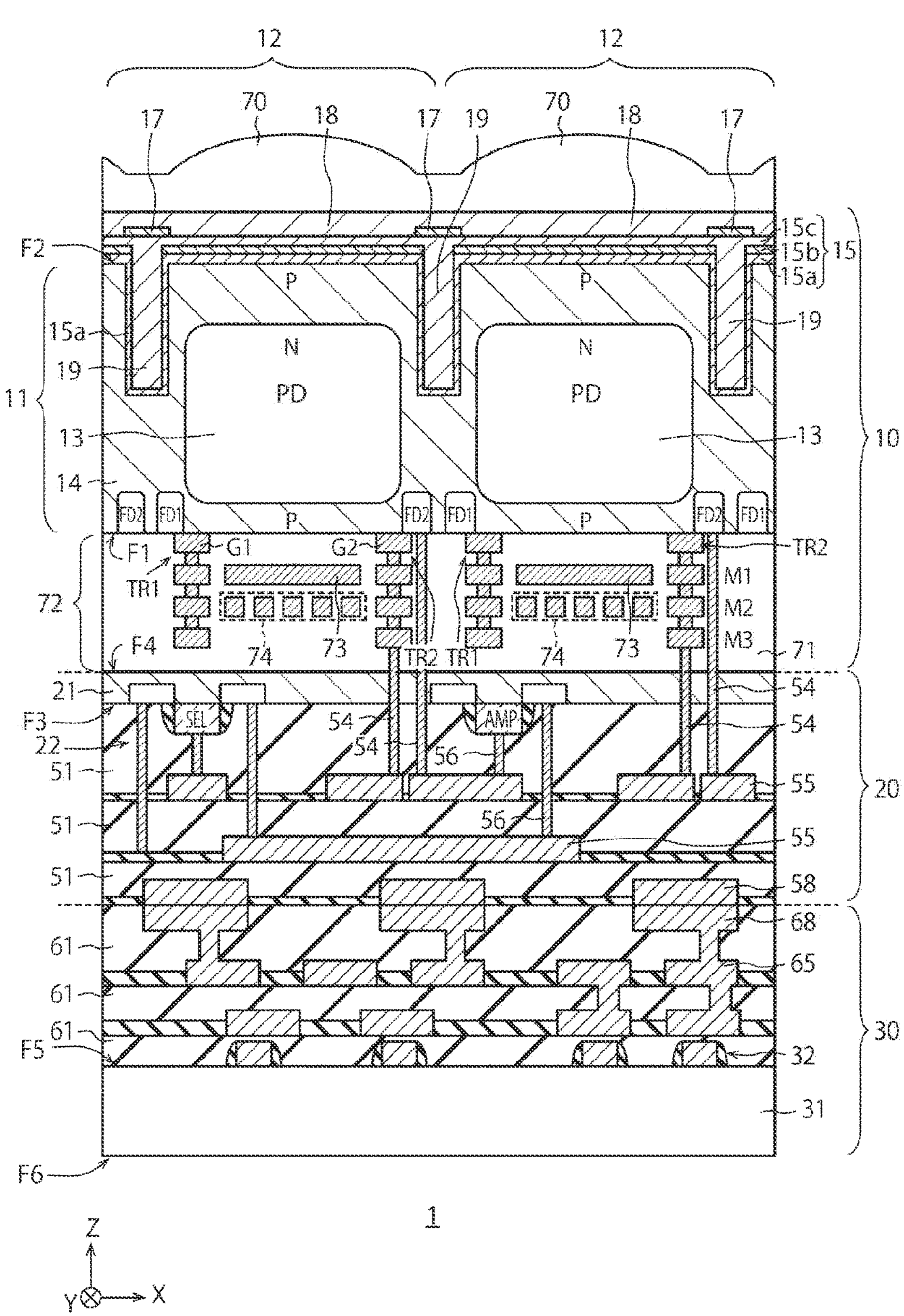
FIG. 5 is a cross-sectional view depicting a configuration example of the light receiving element according to the first embodiment.

FIG. 5 is a cross-sectional view depicting a configuration example of the light receiving element 1 according to the present embodiment. In FIG. 5, each of the transfer sections TR1 and TR2 is constituted by a MOSFET. The voltage application section serves as a gate electrode of the MOSFET of the transfer sections TR1 and TR2. Therefore, hereinafter, the transfer sections TR1 and TR2 are also referred to as transfer transistors TR1 and TR2, respectively. The transfer transistor may be a vertical gate electrode in which a gate electrode is embedded in the semiconductor substrate.

The light receiving element 1 is configured by layering the first substrate 10, the second substrate 20, and a third substrate 30 in this order. Note that, in FIG. 5, the first and second substrates 10 and 20 are disposed with sides of the first surface F1 and a third surface F3 (front surface) facing a −Z direction (downward). On the other hand, the third substrate 30 is disposed with a fifth surface F5 (front surface) side facing a +Z direction (upward). Therefore, the first and second substrates 10 and 20 and the third substrate 30 may be described upside down.

The first substrate 10 includes the semiconductor substrate (first semiconductor layer) 11 having the first surface F1 and a second surface F2 on a side opposite to the first surface F1. For the semiconductor substrate 11, for example, any material of silicon (Si), germanium (Ge), silicon-germanium (SiGe), and indium gallium arsenide (InGaAs) is used. As the semiconductor substrate 11, for example, a p-type (first conductivity type) silicon substrate may be used, or a p-type well may be provided. An on-chip lens 70 is provided on the second surface F2 of the semiconductor substrate 11. The second surface (back surface) F2 of the semiconductor substrate 11 is a light incident surface on which light is incident. For example, one on-chip lens 70 is provided for each pixel 12. Thus, the light receiving element 1 is a back-illuminated sensor.

On the other hand, an interlayer insulating film 71 is provided on the first surface (front surface) F1 of the semiconductor substrate 11. The interlayer insulating film 71 is provided between the semiconductor substrate 11 and a semiconductor substrate 21. For the interlayer insulating film 71, for example, an insulating material such as a silicon oxide film is used. In the interlayer insulating film 71, a plurality of wiring layers is provided to constitute a multilayer wiring layer 72.

In the semiconductor substrate 11, for example, an n-type (second conductivity type) semiconductor region 13 is formed for each pixel, so that a photodiode PD is provided for each pixel 12. A p-type semiconductor region 14 provided on the first and second surfaces F1 and F2 in the semiconductor substrate 11 also serves as a hole charge accumulation region for dark current suppression.

An antireflection film 15 is provided on the second surface F2 of the semiconductor substrate 11. The antireflection film 15 has a stacked structure obtained by stacking a fixed charge film and an oxide film, for example, a high-k insulating thin film obtained by an atomic layer deposition (ALD) method may be used, for example. Specifically, hafnium oxide (HfO2), aluminum oxide (Al2O3), titanium oxide (TiO2), strontium titan oxide (STO), or the like can be used. In the present disclosure, as the antireflection film 15, for example, a stacked film of a hafnium oxide film 15*a*, an aluminum oxide film 15*b*, and a silicon oxide film 15*c* is used.

At the boundary between the pixels 12 adjacent to each other, an inter-pixel light-shielding film 17 is formed above the second surface F2 of the semiconductor substrate 11 in order to suppress entry of incident light into the adjacent pixels.] The material of the inter-pixel light-shielding film 17 is only required to be a material that shields light, and for example, a metal material such as tungsten (W), aluminum (Al), or copper (Cu) can be used.

A planarization film 18 is provided on the antireflection film 15 and the inter-pixel light-shielding film 17. For the planarization film 18, for example, an insulating film such as silicon oxide (SiO2), silicon nitride (SiN), or silicon oxynitride (SiON), or an organic material such as resin is used.

The on-chip lens 70 is formed on the planarization film 18. For the on-chip lens 70, for example, a resin material such as a styrene resin, an acrylic resin, a styrene-acrylic copolymer resin, or a siloxane resin is used. The light condensed by the on-chip lens 70 is efficiently incident on the photodiode PD.

In the boundary region between the pixels 12 adjacent to each other, an element isolation portion 19 is formed from the second surface F2 side of the semiconductor substrate 11 to a predetermined depth in the −Z direction. An outer peripheral portion including a bottom surface and a side wall of the element isolation portion 19 is covered with the hafnium oxide film 15*a* which is a part of the antireflection film 15. The element isolation portion 19 functions to suppress leakage of incident light to the adjacent pixel 12 and to reflect and confine light in the own pixel 12. Furthermore, the inter-pixel light-shielding film 17 may be embedded in the element isolation portion 19, and the function of reflecting and confining light is improved. Furthermore, although not depicted, the element isolation portion 19 may be provided as a trench penetrating the semiconductor substrate.

On the other hand, on the first surface F1 side of the semiconductor substrate 11, the two transfer transistors TR1 and TR2 are provided for each pixel 12 with respect to the photodiode PD of each pixel 12. Furthermore, on the first surface F1 side of the semiconductor substrate 11, the floating diffusion regions FD1 and FD2 as charge accumulation sections that temporarily hold the charge transferred from the photodiode PD are formed by a high-concentration n+ type impurity layer. The transfer transistor TR1 includes a gate electrode G1 as a voltage application section, and transfers the charge generated by the photodiode PD to the floating diffusion region FD1 as a charge accumulation section. The transfer transistor TR2 includes a gate electrode G2 as a voltage application section, and transfers the charge generated by the photodiode PD to the floating diffusion region FD2 as a charge accumulation section.

The multilayer wiring layer 72 includes a plurality of metal films M1 to M3 and the interlayer insulating film 71 that electrically insulates the metal films M1 to M3 from each other. For the metal films M1 to M3, for example, a light-shielding and conductive metal material such as copper or aluminum is used. The metal films M1 to M3 include a plurality of wiring layers and constitute the multilayer wiring layer 72. Furthermore, the metal film M1 closest to the semiconductor substrate 11 includes a light shielding member 73. The light shielding member 73 is formed in the same layer as the metal film M1, and is disposed below the photodiode PD. In a plan view as viewed in the Z direction, the light shielding member 73 overlaps at least a part of the photodiode PD. Thus, the light shielding member 73 is not used as wiring, but suppresses entry of light incident on the pixel 12 into the wiring of the metal films M2 and M3 or the substrates 20 and 30. This prevents the incident light from adversely affecting the wiring of the metal films M2 and M3 or the pixel signals in the substrates 20 and 30. Of course, the light shielding member 73 may have both functions of wiring and light shielding.

Furthermore, the light shielding member 73 reflects the incident light and causes the incident light to be incident on the semiconductor substrate 11 again. Therefore, the light shielding member 73 functions as a light shielding member and a reflecting member. With this reflection function, the amount of light to be photoelectrically converted in the semiconductor substrate 11 can be increased, and quantum efficiency QE (that is, sensitivity of the pixel 12 to light) can be improved. Note that the light shielding member 73 may be formed using polysilicon, a silicon oxide film, or the like in addition to a metal material.

In addition, the light shielding member 73 may be provided in a plurality of layers among the metal films M1 to M3. For example, the light shielding member 73 may include a stripe-shaped metal film M1 extending in an X direction below the photodiode PD and a stripe-shaped metal film M3 extending in a Y direction below the metal film M1. In a plan view as viewed in the Z direction, the metal films M1 and M2 are formed in a lattice shape. Thus, the metal films M1 and M2 may function as the light shielding member 73. In this case, a wiring capacitor 74 may be formed in the metal film M3. The additional capacitors FDL1 and FDL2 in FIG. 3 are configured by the wiring capacitor 74.

According to the present embodiment, the pixel 12 includes two transfer transistors TR1 and TR2 for each photodiode PD, and can distribute charges (electrons) photoelectrically converted by the photodiode PD to the floating diffusion region FD1 or FD2. Therefore, the pixel 12 can function as an iToF. In addition, since the element isolation portion 19, the light shielding member 73, and the like are provided, the amount of light to be photoelectrically converted in the semiconductor substrate 11 increases. As a result, the quantum efficiency QE of the pixel 12 can be improved.

The second substrate 20 includes the semiconductor substrate (second semiconductor layer) 21 having the third surface F3 and a fourth surface F4 on a side opposite to the third surface F3. For the semiconductor substrate 21, for example, any material of silicon (Si), germanium (Ge), silicon-germanium (SiGe), and indium gallium arsenide (InGaAs) is used. As the semiconductor substrate 21, for example, a p-type silicon substrate may be used, or a p-type well may be provided. The fourth surface (back surface) F4 of the semiconductor substrate 21 is bonded to the interlayer insulating film 71 on the first surface (front surface) F1 side of the first substrate 10. That is, the second substrate 20 is bonded to the first substrate 10 in a face-to-back manner.

On the other hand, an interlayer insulating film 51 and a wiring layer 55 are provided on the third surface (front surface) F3 side of the semiconductor substrate 21. The interlayer insulating film 51 and the wiring layer 55 are stacked between the semiconductor substrate 21 and a semiconductor substrate 31, and are configured as a multilayer wiring layer. For the interlayer insulating film 51, for example, an insulating material such as a silicon oxide film is used. For the wiring layer 55, for example, a low-resistance metal material such as copper is used.

The second substrate 20 includes, for example, one readout circuit 22 for every four pixels 12. The second substrate 20 includes a readout circuit 22 on the third surface F3 of the semiconductor substrate 21. The readout circuit 22 includes, for example, pixel transistors such as an amplification transistor AMP, a selection transistor SEL, and a reset transistor RST. Thus, the readout circuit 22 can output the pixel signal based on the charges output from the plurality of pixels 12 to a logic circuit 32 of the third substrate 30.

An electrode plug 54 is provided between the first substrate 10 and the second substrate 20. The electrode plug 54 is connected, for example, between a part of the wiring layer 55 of the second substrate 20 and the floating diffusion region FD1 or FD2 of the first substrate 10, or between a part of the wiring layer 55 of the second substrate 20 and the gate electrode of the transfer transistor TR1 or TR2 of the first substrate 10. The electrode plug 54 can pass through the interlayer insulating film 51 and the interlayer insulating film 71 in the Z direction to electrically connect the floating diffusion region FD1 or FD2 of the first substrate 10 and the wiring layer 55 or a pad electrode 58 of the second substrate 20.

An electrode plug 56 is provided in the interlayer insulating film 51 of the second substrate 20. The electrode plug 56 extends in the Z direction in the interlayer insulating film 51, and connects, for example, a gate, a source, or a drain of the amplification transistor AMP, the selection transistor SEL, the reset transistor RST, or the like constituting the readout circuit 22, and any of the wiring layers 55. For the electrode plugs 54 and 56, for example, a low-resistance metal material such as copper or tungsten is used.

The wiring layer 55 includes, for example, a plurality of pixel drive lines and a plurality of vertical signal lines. Therefore, the transfer transistors TR1 and TR2 are connected to the gate electrodes from the wiring layer 55 via the electrode plug 54. Furthermore, in a case where one readout circuit 22 is provided for each of the four pixels 12, the wiring layer 55 includes wiring connecting the four floating diffusion regions FD1 and FD2 and one amplification transistor AMP.

A plurality of pad electrodes 58 is provided in the third substrate 30 side as a part of the wiring layer 55, and is exposed from the interlayer insulating film 51 of the second substrate 20. For each pad electrode 58, a low-resistance metal material such as copper (Cu) or aluminum (Al) is used. Each pad electrode 58 is used for electrical connection between the second substrate 20 and the third substrate 30 and bonding between the second substrate 20 and the third substrate 30.

The third substrate 30 includes a semiconductor substrate (third semiconductor layer) 31 having the fifth surface F5 and a sixth surface F6 on a side opposite to the fifth surface F5. For the semiconductor substrate 31, for example, any material of silicon (Si), germanium (Ge), silicon-germanium (SiGe), and indium gallium arsenide (InGaAs) is used. As the semiconductor substrate 31, for example, a p-type silicon substrate may be used, or a p-type well may be provided. The fifth surface (front surface) F5 of the semiconductor substrate 31 is provided with an interlayer insulating film 61 and a wiring layer 65. The interlayer insulating film 61 and the wiring layer 65 are stacked between the semiconductor substrate 31 and the second substrate 20, and are configured as a multilayer wiring layer. For the interlayer insulating film 61, for example, an insulating material such as a silicon oxide film is used. For the wiring layer 65, for example, a low-resistance metal material such as copper is used.

Furthermore, the interlayer insulating film 61 on the fifth surface (front surface) side of the third substrate 30 is bonded to the interlayer insulating film 51 on the third surface (front surface) F3 side of the second substrate 20. That is, the third substrate 30 is bonded to the second substrate 20 in a face-to-face manner.

The third substrate 30 includes the logic circuit 32 provided on the fifth surface F5 of the semiconductor substrate 31. A plurality of pad electrodes 68 is provided in the second substrate 20 side as a part of the wiring layer 65, and is exposed from the interlayer insulating film 61 of the third substrate. For each pad electrodes 68, a low-resistance metal material such as copper (Cu) or aluminum (Al) is used. Each pad electrode 68 is used for electrical connection between the second substrate 20 and the third substrate 30 and bonding between the second substrate 20 and the third substrate 30. The second substrate 20 and the third substrate 30 are electrically connected to each other by bonding the pad electrodes 58 and the pad electrodes 68. The pad electrodes 68 are electrically connected to the logic circuit 32 via another wiring layer 65. Therefore, the readout circuit 22 is electrically connected to any one of the logic circuits 32 via the electrode plug 54, the wiring layer 55, the pad electrodes 58 and 68, and the wiring layer 65. For example, respective gate electrodes of the transfer transistor TR, the selection transistor SEL, and the reset transistor RST are electrically connected to any one of the logic circuits 32 via the electrode plug 54, the wiring layer 55, the pad electrodes 58 and 68, and the wiring layer 65.

As described above, according to the present embodiment, the photodiode PD, the transfer transistors TR1 and TR2, and the floating diffusion regions FD1 and FD2 are formed in the first substrate 10, and the pixel transistors (amplification transistor AMP, selection transistor SEL, reset transistor RST, and the like) of the readout circuit 22 is formed in the different second substrate 20. By bonding the first substrate 10 and the second substrate 20 together, the photodiodes PD, the transfer transistors TR1 and TR2, and the floating diffusion regions FD1 and FD2 of the pixel 12 and the pixel transistors of the readout circuit 22 are integrated to constitute the pixel 12. Thus, as depicted in FIGS. 4A and 4B, since it is not necessary to form many of the pixel transistors of the readout circuit 22 in the first substrate 10, it is possible to sufficiently secure the areas of the photodiodes PD, the floating diffusion regions FD1 and FD2, the wiring capacitors 74 (that is, the additional capacitors FDL1 and FDL2), and the like in the first substrate 10. That is, layout restrictions in each pixel 12 can be alleviated. Thus, for example, by increasing the area of the photodiode PD, the photoelectric conversion efficiency can be improved or the charge transfer efficiency can be improved. In addition, the distance measurement accuracy can be improved by increasing the number of the floating diffusion regions FD1 and FD2 to three or more. Moreover, a plurality of sets of the photodiodes PD, the transfer transistors TR1 and TR2, the floating diffusion regions FD1 and FD2, and the additional capacitors FDL1 and FDL2 may be formed in one pixel 12 to provide multiple pixels. This leads to high resolution of image quality. In addition, the layout area of each pixel 12 may be reduced and miniaturized.

By forming the pixel transistors of the readout circuit 22 in the substrate 20 different from the substrate 10 of the pixel 12, it is possible to suppress a neutral region that is likely to occur under the pixel transistor. Thus, it is possible to reduce chances of photoelectric conversion of the incident light in the neutral region and to suppress deterioration of the distance measurement accuracy.

Furthermore, since the pixel transistors of the readout circuit 22 are formed in the second substrate 20, parasitic capacitances of the gate electrodes of the transfer transistors TR1 and TR2 provided in the first substrate 10 are reduced. In particular, in the iToF, the transfer transistors TR1 and TR2 are controlled to be turned on/off at a high frequency such as 10 MHz to 300 MHz. For this reason, when the capacitances of the gate electrodes and the wirings of the transfer transistors TR1 and TR2 are large, the transfer transistors TR1 and TR2 are not sufficiently turned on, and settling may be insufficient. In this case, the distance measurement accuracy decreases.

On the other hand, according to the present embodiment, by providing the pixel transistors in the substrate 20 different from the substrate 10 of the pixel 12, the degree of freedom in the layout of the wirings of the transfer transistors TR1 and TR2 is increased. Thus, the gate capacitance (for example, the wiring capacitance up to the gate electrode) of the transfer transistors TR1 and TR2 can be reduced, and the switching speed of the transfer transistors TR1 and TR2 can be increased.

(In a Case where the Transfer Sections TR1 and TR2 are Current Assisted Photonic Demodulators (CAPDs))

FIG. 6 is a cross-sectional view depicting a configuration example of the light receiving element 1 according to the present embodiment. In FIG. 6, the transfer sections TR1 and TR2 include impurity layers 171 and 172 as voltage application sections and impurity layers 173 and 174 as charge detection sections. Note that the configuration other than the first substrate 10 may be similar to the corresponding configuration in FIG. 5, and thus a detailed description thereof will be omitted.

The inter-pixel light-shielding film 17 is provided between adjacent pixels 12 on the second surface F2 side of the semiconductor substrate 11 of the first substrate 10. The element isolation portion 19 is provided so as to extend in the −Z direction from the second surface F2 of the semiconductor substrate 11. Thus, color mixture (crosstalk) between the pixels 12 can be prevented.

Since the light receiving element 1 is a back-illuminated sensor, the light incident surface is a back surface (second surface F2). The multilayer wiring layer 72 is provided on the first surface F1 and is not provided on the second surface F2. The configuration of the multilayer wiring layer 72 may be similar to that of FIG. 5.

An oxide film 64 and the transfer sections TR1 and TR2 are provided on the first surface F1 side in the semiconductor substrate 11. The transfer section TR1 includes the impurity layers 171_1 and 172_1 as voltage application sections and the impurity layers 173_1 and 174_1 as charge detection sections. The transfer section TR2 includes the impurity layers 171_2 and 172_2 as voltage application sections and the impurity layers 173_2 and 174_2 as charge detection sections.

The voltage application section includes a p+ type impurity layer 171-1 and a p-type impurity layer 172-1 having an impurity concentration lower than that of the impurity layer 171-1. The impurity layer 171-1 is provided closer to the first surface F1 than the impurity layer 172-1, and is covered with the impurity layer 172-1 and the oxide film 64.

The charge detection section includes an n+ type impurity layer 173-1 and an n-type impurity layer 174-1 having an impurity concentration lower than that of the impurity layer 173-1. The impurity layer 173-1 is provided closer to the first surface F1 than the impurity layer 174-1, and is covered with the impurity layer 174-1 and the oxide film 64.

Furthermore, in plan view as viewed in the Z direction, the impurity layers 173_1 and 174_1 as charge detection sections are provided so as to surround the peripheries of the impurity layers 171-1 and 72-1 as voltage application sections. In plan view as viewed in the Z direction, the impurity layers 173_2 and 174_2 as charge detection sections are provided so as to surround the peripheries of the impurity layers 171-2 and 172-2 as voltage application sections.

Note that the impurity layers 171-1 and 171-2 may also be simply referred to as an impurity layer 171 in a case where it is not particularly necessary to distinguish them. The impurity layers 172-1 and 172-2 may also be simply referred to as an impurity layer 172 in a case where it is not particularly necessary to distinguish them. The impurity layers 173-1 and 173-2 may also be simply referred to as an impurity layer 173 in a case where it is not particularly necessary to distinguish them. The impurity layers 174-1 and 174-2 may also be simply referred to as an impurity layer 174 in a case where it is not particularly necessary to distinguish them.

The impurity layer 171 directly applies a voltage to the semiconductor substrate 11 to generate an electric field in the semiconductor substrate 11, and functions as a voltage application section for injecting a majority carrier current into the semiconductor substrate 11. Note that the impurity layer 173 and the impurity layer 174 are electrically connected to each other, and may be regarded as a voltage application section as a unit.

The impurity layer 173 functions as a charge detection section for detecting the amount of signal carriers (the amount of incident light) generated by photoelectric conversion by the semiconductor substrate 11. Note that the impurity layer 171 and the impurity layer 172 are electrically connected to each other, and may be regarded as a charge detection section as a unit.

The impurity layer 173_1 functions as the floating diffusion region FD1. Alternatively, the floating diffusion region FD1 (not depicted) may be connected to the impurity layer 173_1. Moreover, as depicted in FIG. 3, the floating diffusion region FD1 is connected to the vertical signal line 29A via the amplification transistor AMP1 and the like. Similarly, the impurity layer 173_2 functions as the floating diffusion region FD2. Alternatively, the floating diffusion region FD2 (not depicted) may be connected to the impurity layer 173_2. Moreover, the floating diffusion region FD2 is connected to the vertical signal line 29B via the amplification transistor AMP2 and the like.

In the read operation, in the first period, the vertical drive section 220 alternately applies voltages to the two impurity layers 171_1 and 171_2 by the control signals TR1*g* and TR2*g*. For example, in the first period, the vertical drive section 220 applies a voltage of 1.5 V to the impurity layer 171-1 and applies a voltage of 0 V to the impurity layer 171-2.

At this time, an electric field is generated between the impurity layer 171_1 and the impurity layer 171_2, and charges (electrons) move from the impurity layer 171-2 to the impurity layer 171-1. In such a state, when infrared light (reflected light) is incident on the semiconductor substrate 11 from the outside, the infrared light is photoelectrically converted in the semiconductor substrate 11, and charges (electrons) are generated. The electrons are guided toward the impurity layer 171-1, and move and are accumulated in the impurity layer 173-1 (that is, the floating diffusion region FD1).

Furthermore, in the next second period, the vertical drive section 220 applies voltages to the two impurity layers 171_1 and 171_2 by the control signals TR1*g* and TR2*g* so that an electric field in the opposite direction is generated in the semiconductor substrate 11. For example, in the second period, the vertical drive section 220 applies a voltage of 1.5 V to the impurity layer 171-2 and applies a voltage of 0 V to the impurity layer 171-1.

At this time, an electric field is generated between the impurity layer 171_1 and the impurity layer 171_2, and charges (electrons) move from the impurity layer 171-1 to the impurity layer 171-2. In such a state, when infrared light (reflected light) is incident on the semiconductor substrate 11 from the outside, the infrared light is photoelectrically converted in the semiconductor substrate 11, and charges (electrons) are generated. The electrons are guided toward the impurity layer 171-2, and move and are accumulated in the impurity layer 173-2 (that is, the floating diffusion region FD2).

The first and second periods are periodically and alternately repeated in synchronization with the period of the irradiation light from the light emitting element 2. Thus, the impurity layers 173-1 and 173_2 (that is, the floating diffusion regions FD1 and FD2) can accumulate charges corresponding to the phase difference between the irradiation light from the light emitting element 2 and the reflected light received by the light receiving element 1.

As described above, even in a case where the transfer sections TR1 and TR2 are impurity layers, the same operation as in a case where the transfer sections TR1 and TR2 are MOSFETs can be executed, and an effect can be obtained. In addition, since it is not necessary to form many of the pixel transistors of the readout circuit 22 in the first substrate 10, another impurity layer 171_3 to 174_3 may be further provided in an empty space of the first substrate 10 of each pixel 12. That is, the number of sets (the number of taps) n of the impurity layers 171_*n* to 74_*n* (n is an integer) in each pixel 12 can be increased to 3 or more without increasing the layout area of each pixel 12 so much.

Second Embodiment

Figure 7:
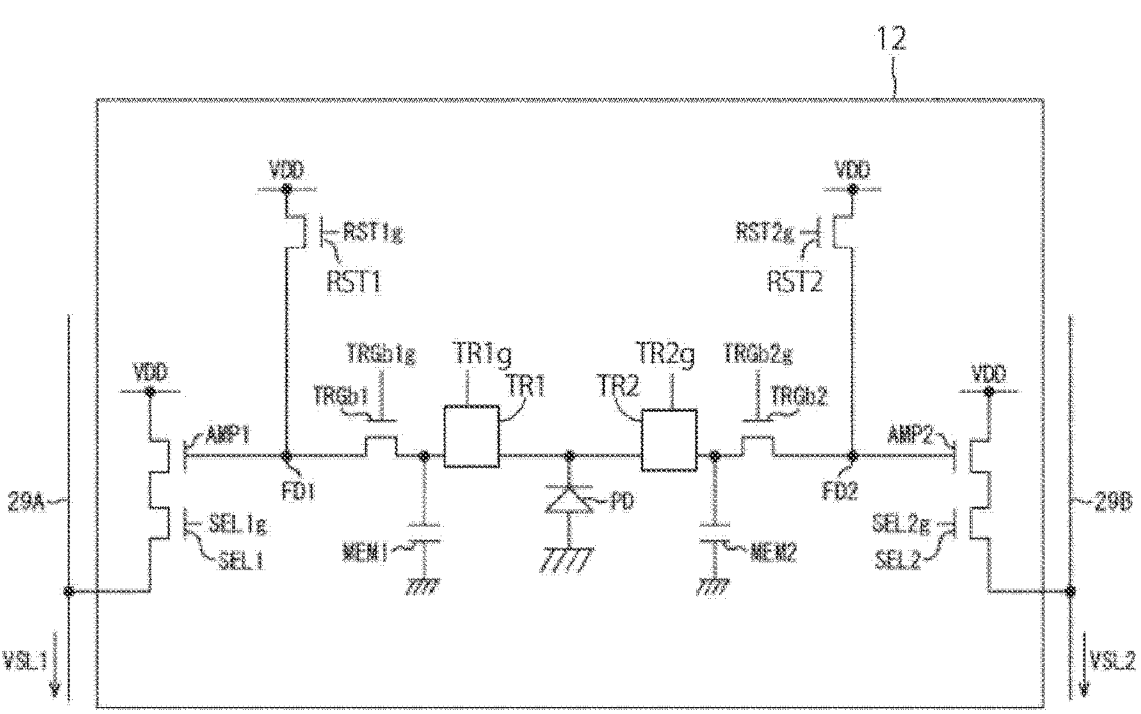
FIG. 7 is a diagram depicting an example of a circuit configuration of a pixel according to a second embodiment.

FIG. 7 is a diagram depicting an example of a circuit configuration of the pixel 12 according to a second embodiment. In the second embodiment, memories MEM1 and MEM2 are provided. The charge from the photodiode PD is once distributed to the memories MEM1 and MEM2 and then transferred to the floating diffusion regions FD1 and FD2. Thus, the second embodiment can be applied to a global shutter system capable of simultaneously accumulating charges from the photodiodes PD in the respective pixels 12 in the memories MEM1 and MEM2. Note that, in FIG. 7, parts corresponding to those in FIG. 3 are denoted by the same reference numerals, and description of the parts will be omitted as appropriate.

The pixel 12 includes the photodiode PD, the transfer sections TR1 and TR2, the memories MEM1 and MEM2, transfer transistors TRGb1 and TRGb2, the floating diffusion regions FD1 and FD2, the amplification transistors AMP1 and AMP2, the reset transistors RST1 and RST2, and the selection transistors SEL1 and SEL2.

The memory MEM1 is a capacitive element connected between a node between the transfer section TR1 and the transfer transistor TRGb1 and the ground. The memory MEM1 accumulates and holds the charge transferred from the photodiode PD when the transfer section TR1 is in an ON state. The memory MEM2 is a capacitive element connected between a node between the transfer section TR2 and the transfer transistor TRGb2 and the ground. The memory MEM2 accumulates and holds the charge transferred from the photodiode PD when the transfer section TR2 is in an ON state. In this manner, the memories MEM1 and MEM2 accumulate and hold the charges distributed from the photodiode PD by the transfer sections TR1 and TR2. In this manner, the memories MEM1 and MEM2 function as a charge holding section that holds the charges distributed from the photodiode PD by the transfer sections TR1 and TR2. The memories MEM1 and MEM2 are only required to include, for example, a capacitive element such as a metal-on-metal (MoM), a metal-insulator-metal (MIM), or a MOS capacitor.

The transfer transistor TRGb1 is connected between one end of the memory MEM1 and the floating diffusion region FD1. The transfer transistor TRGb2 is connected between one end of the memory MEM2 and the floating diffusion region FD2. The transfer transistors TRGb1 and TRGb2 are constituted by, for example, n-type MOSFETs. The transfer transistor TRGb1 is in a conductive state when the transfer signal TRGb1*g* is in an active state, and connects the memory MEM1 to the floating diffusion region FD1. Thus, the transfer transistor TRGb1 transfers the charge accumulated in the memory MEM1 to the floating diffusion region FD1. The transfer transistor TRGb2 is in a conductive state when the transfer signal TRGb2*g* is in an active state, and connects the memory MEM2 to the floating diffusion region FD2. The transfer transistor TRGb2 transfers the charge accumulated in the memory MEM2 to the floating diffusion region FD2.

The reset transistor RST1 is in a conductive state when the reset drive signal RST1*g* is in an active state, and resets the potentials of the floating diffusion region FD1 and the memory MEM1. The reset transistor RST2 is in a conductive state when the reset drive signal RST2*g* is in an active state, and resets the potentials of the floating diffusion region FD2 and the memory MEM2. Note that, when the reset transistors RST1 and RST2 are set to the active state, the transfer transistors TRGb1 and TRGb2 are also set to the active state at the same time, and the memories MEM1 and MEM2 are also reset.

The charge from the photodiode PD is distributed and accumulated in the memories MEM1 and MEM2. After charges are accumulated in the memories MEM1 and MEM2 of all the pixels 12, the charges held in the memories MEM1 and MEM2 are transferred to the floating diffusion regions FD1 and FD2 of each pixel 12 at a reading timing. Thus, the second embodiment is suitable for the global shutter system.

Figure 8A:
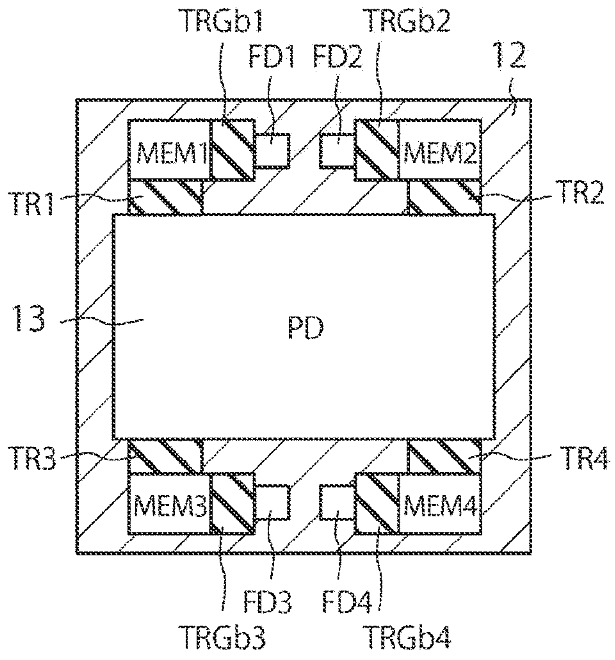
FIGS. 8A and 8B are plan views of a first substrate of a pixel according to the second embodiment.
Figure 8B:
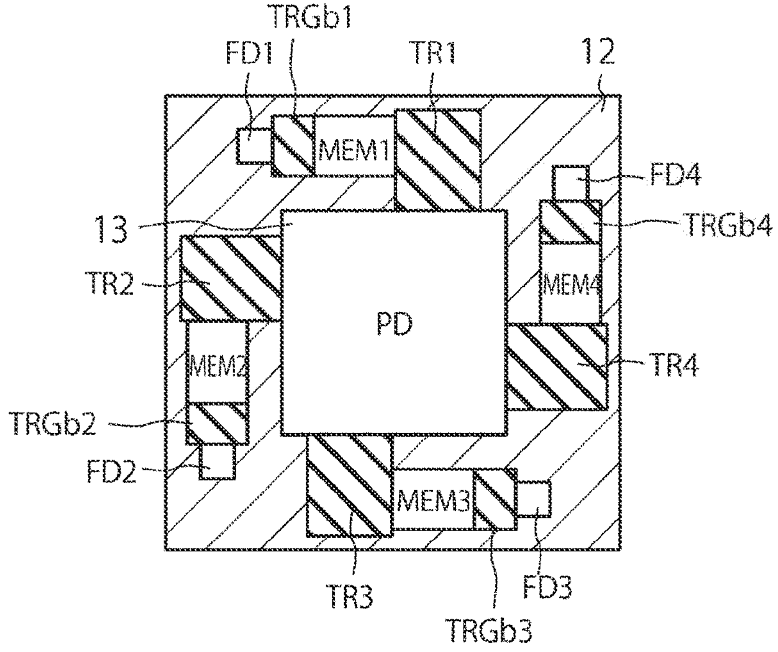

FIGS. 8A and 8B are plan views of the first substrate 10 of the pixel 12 according to the second embodiment. The horizontal direction in FIGS. 8A and 8B corresponds to the row direction (horizontal direction) in FIG. 2, and the vertical direction corresponds to the column direction (vertical direction) in FIG. 2. In FIGS. 8A and 8B, four taps (TR1 to TR4) are provided in one pixel 12. Also in the present embodiment, since the reset transistors, the amplification transistors, and the selection transistors are provided in the second substrate 20, four taps can be provided in the pixel 12 of the first substrate 10.

As depicted in FIGS. 8A and 8B, the n-type impurity layer 13 is provided as the photodiode PD. In a plan view as viewed in the Z direction, the photodiode PD has a substantially rectangular outer shape.

In FIG. 8A, the transfer section TR1, the memory MEM1, the transfer transistor TRGb1, and the floating diffusion region FD1 are linearly arranged along a predetermined side (first side) of four sides of the rectangular pixel 12 outside the photodiode PD. Furthermore, the transfer section TR2, the memory MEM2, the transfer transistor TRGb2, and the floating diffusion region FD2 are linearly arranged along the same first side. The transfer section TR3, the memory MEM3, the transfer transistor TRGb3, and the floating diffusion region FD3 are linearly arranged along another side (opposite side of the first side) of the four sides of the rectangular pixel 12. Furthermore, the transfer section TR4, the memory MEM4, the transfer transistor TRGb4, and the floating diffusion region FD4 are linearly arranged along the opposite side of the first side. The depiction of the charge discharge transistor OFG is omitted here.

In FIG. 8B, the transfer section TR1, the memory MEM1, the transfer transistor TRGb1, and the floating diffusion region FD1 are linearly arranged along one side (first side) of four sides of the rectangular pixel 12 outside the photodiode PD. The transfer section TR2, the memory MEM2, the transfer transistor TRGb2, and the floating diffusion region FD2 are linearly arranged along a second side adjacent to the first side of the pixel 12. The transfer section TR3, the memory MEM3, the transfer transistor TRGb3, and the floating diffusion region FD3 are linearly arranged along a third side adjacent to the second side of the pixel 12. Moreover, the transfer section TR4, the memory MEM4, the transfer transistor TRGb4, and the floating diffusion region FD4 are linearly arranged along a fourth side adjacent to the third side of the pixel 12. Also in FIG. 8B, depiction of the charge discharge transistor OFG is omitted. Other configurations of the second embodiment may be similar to those of the first embodiment. Therefore, the second embodiment can obtain effects similar to those of the first embodiment.

Here, since the reset transistors RST1 to RST4, the amplification transistors AMP1 to AMP4, and the selection transistors SEL1 to SEL4 (pixel transistors) are provided in the second substrate 20, they are not depicted in FIGS. 8A and 8B. As described above, by arranging the reset transistors RST1 to RST4, the amplification transistors AMP1 to AMP4, and the selection transistors SEL1 to SEL4 in the second substrate 20, a space for increasing taps is generated in the pixel 12 of the first substrate 10. Thus, for example, four taps can be provided in each pixel 12. According to the present embodiment, as depicted in FIG. 8A, it is also possible to increase the number of taps while maintaining a relatively large layout area of the photodiode PD. As depicted in FIG. 8B, the charge transfer capability of the transfer sections TR1 to TR4 may be improved by increasing the number of taps and increasing the layout area of the transfer sections TR1 to TR4. The arrangement is not limited to the arrangement examples of FIGS. 8A and 8B, and other arrangements may be employed. For example, even if some transistors of the pixel transistors are provided in the first substrate 10, the effect of the present embodiment is not lost.

In addition, although four taps are provided in FIGS. 8A and 8B, the number of taps may be three or less or five or more. For example, in a case where the number of taps is three, it is only required to omit the floating diffusion region FD4, the transfer transistor TRGb4, the memory MEM4, and the transfer section TR4 depicted in FIG. 8A or 8B. Similarly to the floating diffusion regions FD1 and FD2, the floating diffusion region FD3 is provided on the first surface F1 side of the semiconductor substrate 11. Similarly to the transfer sections TR1 and TR2, the transfer section TR3 includes a voltage application section that is provided on the semiconductor substrate 11 between the floating diffusion region FD3 and the photoelectric conversion section PD and applies a voltage to the semiconductor substrate 11. Similarly to the memories MEM1 and MEM2, the memory MEM3 accumulates the charge distributed from the photodiode PD. At the timing of reading, the charge held in the memory MEM3 is transferred to the floating diffusion region FD3 of each pixel 12 via the transfer transistor TRGb3. Three pixel transistors such as the reset transistors RST1 to RST3, the amplification transistors AMP1 to AMP3, and the selection transistors SEL1 to SEL3 are also provided in the second substrate 20. Thus, each pixel 1 may have three taps.

The present technology can be applied to various electric devices (for example, a camera, a smartphone, an automobile, or the like) having an imaging function.

(Application Example to Mobile Body)

The technology according to the present disclosure (the present technology) can be applied to various products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a ship, and a robot.

FIG. 9 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 9, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 9, an audio speaker 12061, a display section 12062, and an instrument panel 12063 are illustrated as the output device. The display section 12062 may, for example, include at least one of an on-board display and a head-up display.

Figure 10:
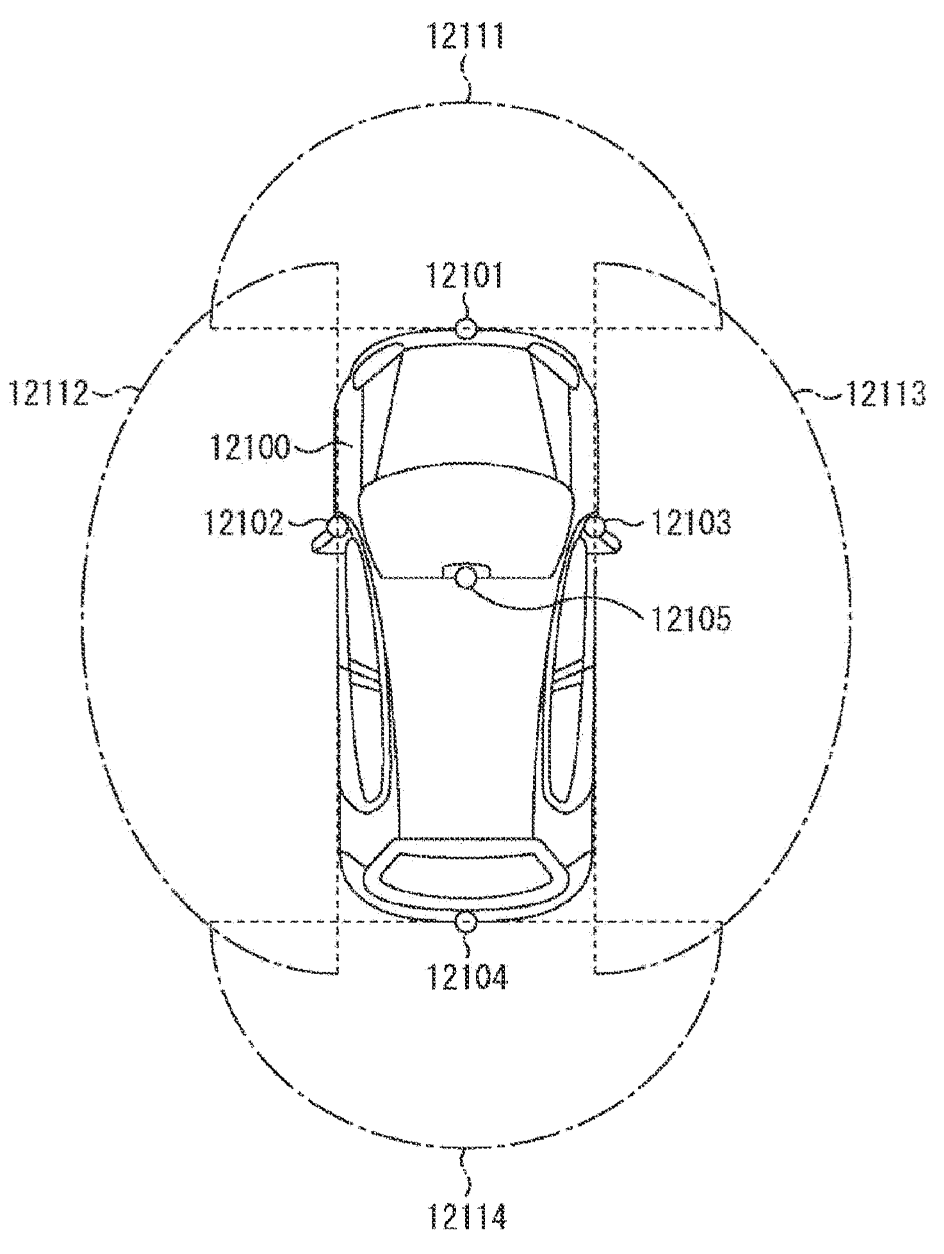
FIG. 10 is a diagram of assistance in explaining an example of installation positions of an outside-vehicle information detecting section and an imaging section.

FIG. 10 is a diagram depicting an example of the installation position of the imaging section 12031.

In FIG. 10, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 10 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Third Embodiment

FIG. 11 is a cross-sectional view depicting a configuration example of the light receiving element 1 according to a third embodiment. In the third embodiment, a fourth substrate 40 is bonded to the second surface of the first substrate 10 with respect to the first to third substrates 10 to 30. The fourth substrate 40 includes a photodiode PD40. The photodiode PD40 is provided above the photodiode PD of the first substrate 10, and overlaps the photodiode PD in each pixel 12 when viewed in the Z direction. That is, in the third embodiment, a plurality of photodiodes PD and PD40 is stacked in the Z direction for each pixel 12.

The configurations of the first to third substrates 10 to 30 may be similar to those of the first embodiment. Therefore, here, the fourth substrate 40 and a configuration related thereto will be described. Note that, in FIGS. 11 to 16, the display of the wiring layer, the element isolation portion, and the like is simplified or omitted.

The fourth substrate 40 includes a fourth semiconductor layer 44 having a seventh surface F7 and an eighth surface F8 on a side opposite to the seventh surface F7. For the fourth semiconductor layer 44, for example, any material of silicon (Si), germanium (Ge), silicon-germanium (SiGe), and indium gallium arsenide (InGaAs) is used. For the fourth semiconductor layer 44, for example, a p-type (first conductivity type) silicon substrate may be used, or a p-type well may be provided. An on-chip lens (not depicted in FIGS. 11 to 16) is provided on the eighth surface F8 of the fourth semiconductor layer 44. The eighth surface (back surface) F8 of the fourth semiconductor layer 44 is a light incident surface on which light is incident. For example, one on-chip lens is provided for each pixel 12. Thus, the light receiving element 1 is a back-illuminated sensor.

On the other hand, the seventh surface (front surface) F7 of the fourth semiconductor layer 44 is bonded to the second surface F2 of the first substrate 10.

In the fourth semiconductor layer 44, for example, an n-type (second conductivity type) semiconductor region 43 is formed for each pixel, so that a photodiode PD is provided for each pixel 12. A p-type semiconductor region 14 is provided on the first and second surfaces F1 and F2 in the fourth semiconductor layer 44.

The configuration on the eighth surface F8 of the fourth semiconductor layer 44 may be similar to the configuration on the second surface F2 of the first embodiment. Therefore, an antireflection film, an on-chip lens, and the like may be provided.

At the boundary between the pixels 12 adjacent to each other, an inter-pixel light-shielding film and an element isolation portion (not depicted) may be provided on the eighth surface F8 side of the fourth semiconductor layer 44 in order to suppress entry of incident light into the adjacent pixels 12. The configurations of the inter-pixel light-shielding film and the element isolation portion may be similar to the configurations of the inter-pixel light-shielding film 17 and the element isolation portion 19 of the first embodiment.

In the boundary region between the fourth semiconductor layers 44 of the pixels adjacent to each other, an element isolation portion (not depicted) may be formed from the eighth surface F8 side of the fourth semiconductor layer 44 to a predetermined depth in the −Z direction. The configuration of the element isolation portion may be similar to the configuration of the element isolation portion 19 of the first substrate 10.

On the other hand, on the seventh surface F7 side of the fourth semiconductor layer 44, two transfer transistors TR41 and TR42 are provided for each pixel 12 with respect to the photodiode PD40 of the fourth semiconductor layer 44. Furthermore, on the seventh surface F7 side of the fourth semiconductor layer 44, floating diffusion regions FD41 and FD42 as charge accumulation sections that temporarily hold the charge transferred from the photodiode PD40 are formed by a high-concentration n+ type impurity layer. The transfer transistor TR41 includes a gate electrode G41 as a voltage application section, and applies a voltage to the fourth semiconductor layer 44 between the floating diffusion region FD41 and the photodiode PD40. The transfer transistor TR41 transfers the charge generated by the photodiode PD to the floating diffusion region FD41 as a charge accumulation section. The transfer transistor TR42 includes a gate electrode G42 as a voltage application section, and applies a voltage to the fourth semiconductor layer 44 between the floating diffusion region FD42 and the photodiode PD40. The transfer transistor TR42 transfers the charge generated by the photodiode PD40 to the floating diffusion region FD42 as a charge accumulation section.

In the third embodiment, the amplification transistors AMP1 and AMP2 are electrically connected between the floating diffusion regions FD1 and FD2 and the vertical signal lines 29 of FIG. 3, respectively, and output voltages amplified according to the potentials of the floating diffusion regions FD1 and FD2 to the vertical signal lines 29 as pixel signals. Amplification transistors AMP41 and AMP42 are electrically connected between the floating diffusion regions FD42 and FD42 and the vertical signal lines 29, respectively, and output voltages amplified according to the potentials of the floating diffusion regions FD41 and FD42 to the vertical signal lines 29 as pixel signals.

Other pixel transistors such as the selection transistor SEL and the reset transistor RST may be shared by the photodiodes PD and PD40. That is, at least a part of the pixel transistors may be shared by the photodiodes PD and PD40.

The pixel signals amplified by the amplification transistors AMP1 and AMP41 may be simultaneously output as the same signal from the selection transistor SEL to the vertical signal line 29, or may be output as different signals from each other from the selection transistor to the vertical signal line 29 at different timings.

According to the present embodiment, the pixel 12 includes two transfer transistors TR1 and TR2 and two transfer transistors TR41 and TR42 for the respective photodiodes PD and PD40, and can distribute charges (electrons) photoelectrically converted by the photodiode PD to the floating diffusion region FD1 or FD2 and the floating diffusion region FD41 or FD42. Therefore, the pixel 12 can function as an iToF.

Moreover, a plurality of photodiodes PD and PD40 is stacked in the light incident direction (Z direction), and a pixel signal from each photodiode is detected. Thus, the light receiving element 1 can perform highly accurate distance measurement using the distance to the object calculated using the pixel signal obtained from the photodiode PD and the distance to the object calculated using the pixel signal obtained from the photodiode PD40. For example, the light receiving element 1 may calculate an average value of distances using the pixel signals from the plurality of photodiodes PD and PD40, and set the average value as the distance to the object. By using the plurality of stacked photodiodes PD and PD40, the thickness of the photodiode is substantially increased, and the absorption rate of near-infrared light or the like is increased. Thus, the light receiving element 1 can accurately measure the distance to the object.

Other configurations of the third embodiment may be similar to those of the first embodiment. In the third embodiment, both the pixel signals from the photodiodes PD and PD40 are used for distance measurement, but as depicted in FIG. 17, one of the pixel signals from the photodiodes PD and PD40 may be used for distance measurement, and the other may be used for obtaining an image.

Furthermore, the third embodiment may be applied to the second embodiment. That is, the third embodiment can also be applied to a case where the transfer sections TR1 and TR2 are CAPD as depicted in FIG. 6.

Fourth Embodiment

Figure 12:
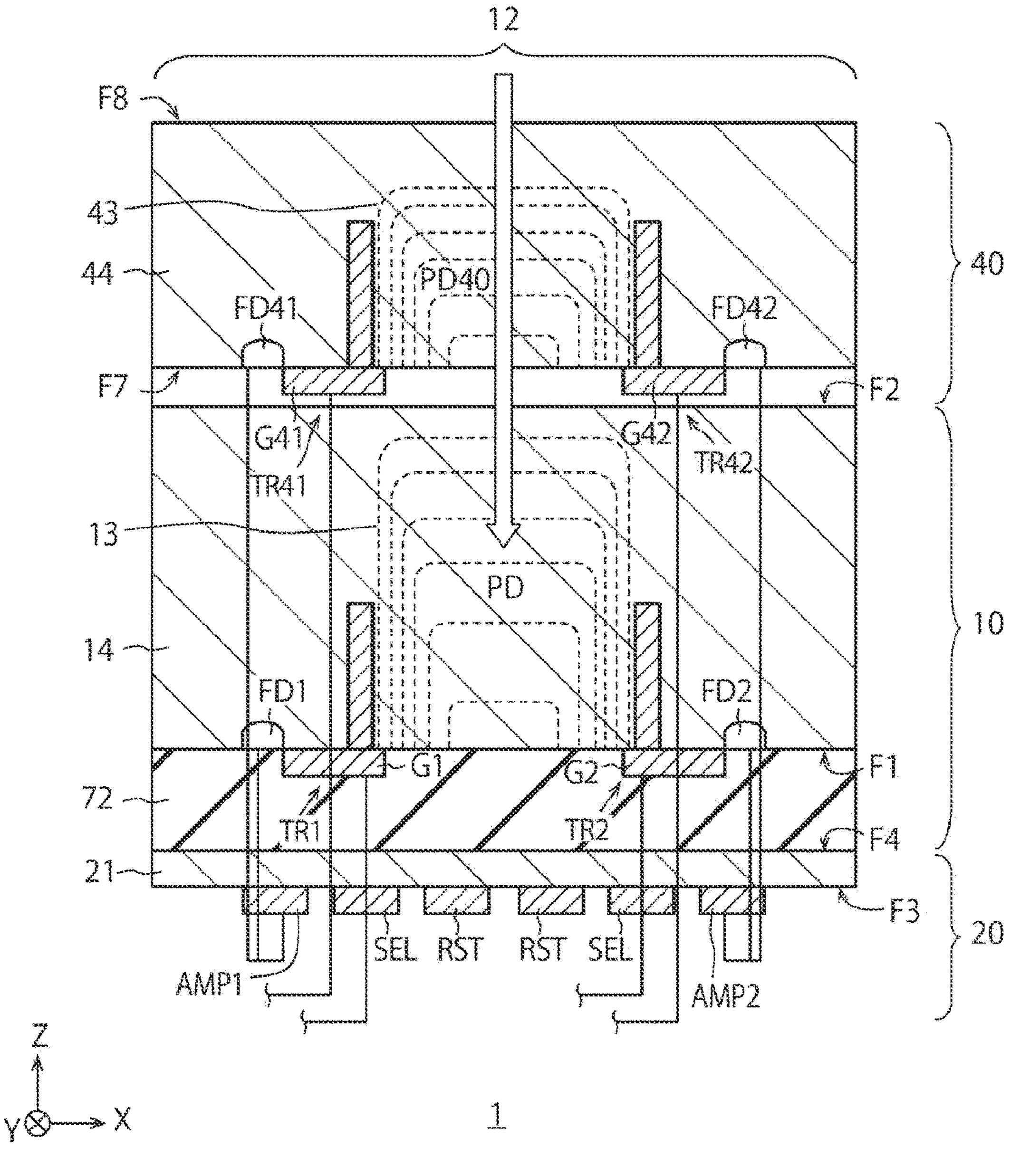
FIG. 12 is a cross-sectional view depicting a configuration example of the light receiving element according to a fourth embodiment.

FIG. 12 is a cross-sectional view depicting a configuration example of the light receiving element 1 according to a fourth embodiment. In the fourth embodiment, the amplification transistor AMP1 is shared by the floating diffusion regions FD1 and FD41, and the amplification transistor AMP2 is shared by the floating diffusion regions FD2 and FD42. Therefore, the floating diffusion regions FD1 and FD41 are electrically connected to the vertical signal line 29 via the common amplification transistor AMP1. The floating diffusion regions FD2 and FD42 are electrically connected to the vertical signal line 29 via the common amplification transistor AMP2. The amplification transistors AMP41 and AMP42 are omitted.

The pixel signals amplified by the amplification transistors AMP1 and AMP41 are simultaneously output as the same signal from the selection transistor SEL to the vertical signal line 29. In the fourth embodiment, the pixel signals amplified by the amplification transistors AMP1 and AMP41 cannot be separately output as different signals from the selection transistor SEL to the vertical signal line 29. However, since the amplification transistors AMP41 and AMP42 are omitted, each pixel 12 can be further downsized.

Other configurations of the fourth embodiment may be similar to those of the third embodiment. Therefore, the fourth embodiment can obtain effects similar to those of the third embodiment.

Fifth Embodiment

Figure 13:
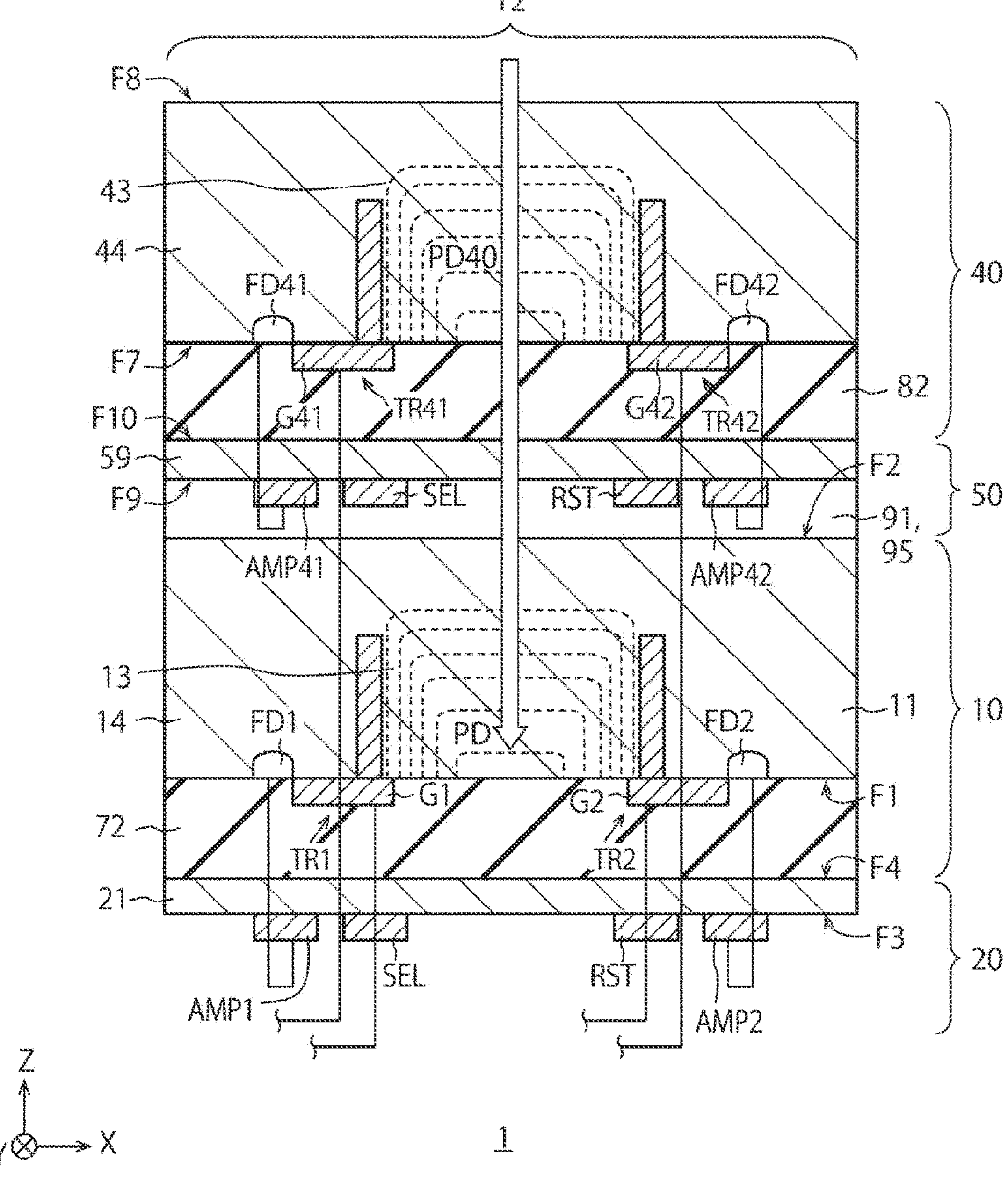
FIG. 13 is a cross-sectional view depicting a configuration example of the light receiving element according to a fifth embodiment.

FIG. 13 is a cross-sectional view depicting a configuration example of the light receiving element 1 according to a fifth embodiment. In the fifth embodiment, pixel transistors such as a reset transistor, an amplification transistor, and a selection transistor are separately provided in each of the photodiodes PD and PD40. The pixel transistors corresponding to the photodiode PD are provided in the second substrate 20 as in the first embodiment. The pixel transistors corresponding to the photodiode PD40 are provided in a fifth substrate 50 different from the second substrate 20. That is, the pixel transistor that outputs the pixel signal based on the charge output from the photodiode PD40 is formed in the fifth substrate 50 provided between the first substrate 10 and the fourth substrate 40.

The fifth substrate 50 includes a semiconductor substrate (fifth semiconductor layer) 59 having a ninth surface F9 and a tenth surface F10 on a side opposite to the ninth surface F9. For the semiconductor substrate 59, for example, any material of silicon (Si), germanium (Ge), silicon-germanium (SiGe), and indium gallium arsenide (InGaAs) is used. As the semiconductor substrate 59, for example, a p-type silicon substrate may be used, or a p-type well may be provided. The tenth surface (back surface) F10 of the semiconductor substrate 59 is bonded to an interlayer insulating film 82 on the seventh surface (front surface) F7 side of the fourth substrate 40. That is, the fifth substrate 50 is bonded to the fourth substrate 40 in a face-to-back manner.

On the other hand, an interlayer insulating film 91 and a wiring layer 95 are provided on the ninth surface (front surface) F9 side of the semiconductor substrate 59. The interlayer insulating film 91 and the wiring layer 95 are stacked between the semiconductor substrate 59 and the semiconductor substrate 11, and are configured as a multilayer wiring layer. For the interlayer insulating film 91, for example, an insulating material such as a silicon oxide film is used. For the wiring layer 95, for example, a low-resistance metal material such as copper is used.

The other configuration of the fifth substrate 50 may be basically the same as the configuration of second substrate 20. The planar layout of the readout circuit and the pixel transistors of the fifth substrate 50 may be similar to that of the second substrate 20.

An electrode plug (not depicted) is provided in the interlayer insulating film 91 of the fifth substrate 50. The electrode plug extends in the Z direction in the interlayer insulating film 91, and connects, for example, a gate, a source, or a drain of the amplification transistor AMP, the selection transistor SEL, the reset transistor RST, or the like to any of the wiring layers 95.

As described above, the fifth substrate 50 is provided with respect to the fourth substrate 40 similarly to the second substrate 20 with respect to the first substrate 10. The second substrate 20 includes the pixel transistors corresponding to the photodiode PD, and the fifth substrate 50 includes the pixel transistors corresponding to the photodiode PD40. Thus, the pixel signal from the photodiode PD is output from the pixel transistor of the second substrate 20. The pixel signal from the photodiode PD40 is output from the pixel transistor of the fifth substrate 50.

Other configurations of the fifth embodiment may be similar to those of the third embodiment. Therefore, the fifth embodiment can obtain effects similar to those of the third embodiment.

Sixth Embodiment

Figure 14:
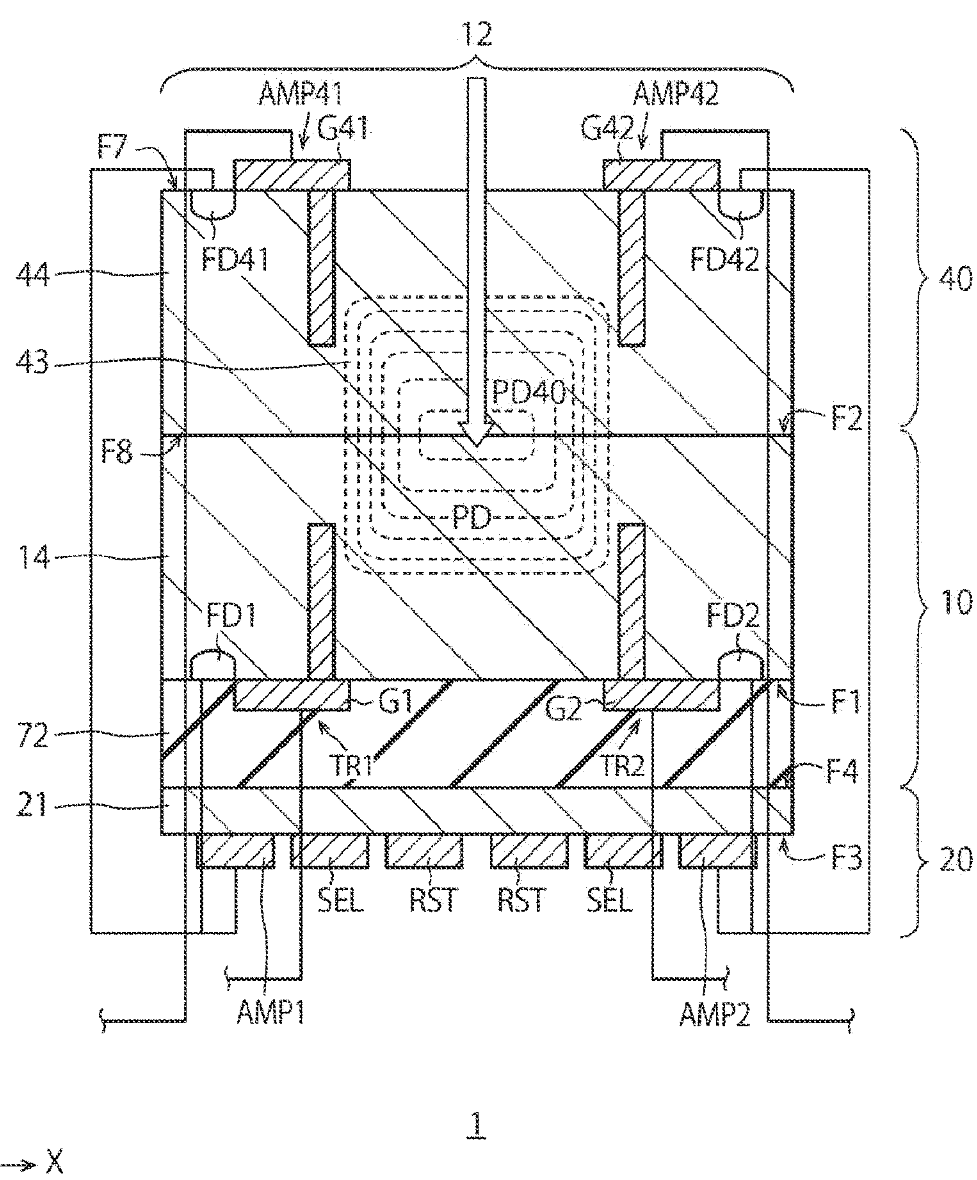
FIG. 14 is a cross-sectional view depicting a configuration example of the light receiving element according to a sixth embodiment.

FIG. 14 is a cross-sectional view depicting a configuration example of the light receiving element 1 according to a sixth embodiment. In the sixth embodiment, in the fourth substrate 40, the eighth surface (back surface) F8 of the fourth semiconductor layer 44 is bonded to the second surface (back surface) F2 of the first substrate 10. That is, the fourth substrate 40 is bonded to the first substrate 10 in a back-to-back manner. In this case, the seventh surface (front surface) F7 of the fourth substrate 40 is the light incident surface. The floating diffusion regions FD1 and FD41 are provided on the seventh surface F7 side of the fourth semiconductor layer 44 and share the amplification transistor AMP1. The floating diffusion regions FD2 and FD42 share the amplification transistor AMP2. The photodiode PD40 is formed by introducing impurities from the eighth surface F8 side. Therefore, the photodiodes PD and PD40 are configured as one integrated photodiode by bonding the second surface F2 and the eighth surface F8. Other configurations of the sixth embodiment may be similar to those of the fourth embodiment. Therefore, the sixth embodiment can obtain effects similar to those of the fourth embodiment.

Seventh Embodiment

Figure 15:
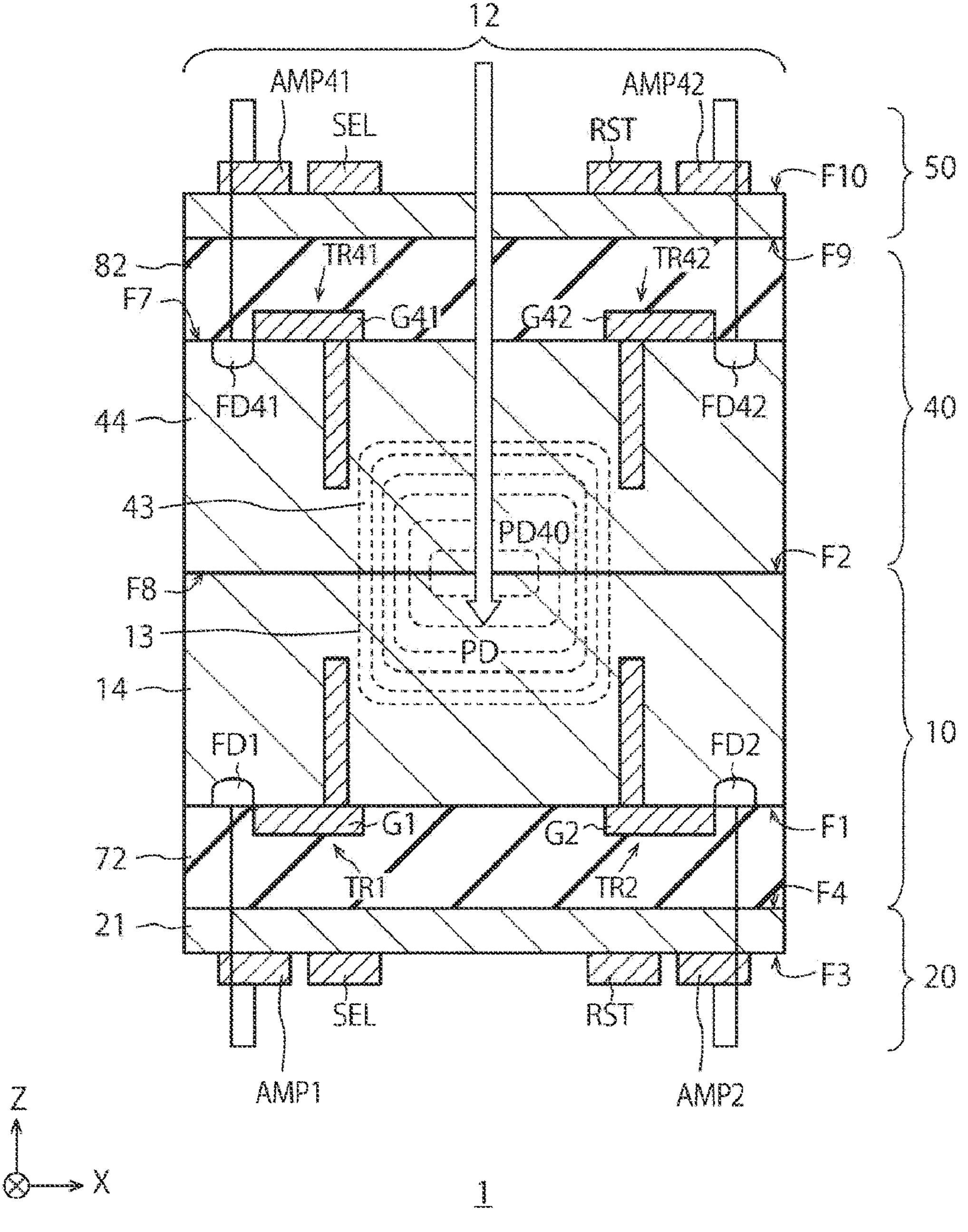
FIG. 15 is a cross-sectional view depicting a configuration example of the light receiving element according to a seventh embodiment.

FIG. 15 is a cross-sectional view depicting a configuration example of the light receiving element 1 according to a seventh embodiment. In the seventh embodiment, the eighth surface (back surface) F8 of the fourth substrate 40 is bonded to the second surface (back surface) F2 of the first substrate 10. That is, the fourth substrate 40 is bonded to the first substrate 10 in a back-to-back manner. In this case, the seventh surface (front surface) F7 of the fourth substrate 40 is the light incident surface. The floating diffusion regions FD1 and FD41 are connected to the individual amplification transistors AMP1 and AMP41, respectively. The floating diffusion regions FD2 and FD42 are connected to the individual amplification transistors AMP2 and AMP42, respectively.

Moreover, in the seventh embodiment, pixel transistors such as a reset transistor, an amplification transistor, and a selection transistor are separately provided in each of the photodiodes PD and PD40 as in the fifth embodiment. The pixel transistors corresponding to the photodiode PD are provided in the second substrate 20 as in the sixth embodiment. The pixel transistors corresponding to the photodiode PD40 are provided in the fifth substrate 50 different from the second substrate 20. That is, the fifth substrate 50 includes pixel transistors (AMP41, AMP42, SEL, RST) that are provided on the seventh surface F7 side of the fourth substrate 40 and output a pixel signal based on the charge output from the photodiode PD40.

The configuration of the fifth substrate 50 may be basically the same as that of the fifth embodiment. However, the ninth surface (front surface) F9 of the semiconductor substrate 59 is the light incident surface. On the other hand, the tenth surface (back surface) F10 of the semiconductor substrate 59 is bonded to the interlayer insulating film 82 on the seventh surface F7 of the fourth substrate 40. A multilayer wiring layer (not depicted) is provided in the interlayer insulating film 82. That is, in the seventh embodiment, the fourth and fifth substrates 40 and 50 of the fifth embodiment are reversed in the Z direction, and the fourth substrate 40 is bonded to the first substrate 10 in a back-to-back manner.

Other configurations of the seventh embodiment may be similar to those of the fifth embodiment. Therefore, the seventh embodiment can obtain effects similar to those of the fifth embodiment.

Eighth Embodiment

FIG. 16 is a cross-sectional view depicting a configuration example of the light receiving element 1 according to an eighth embodiment. In the eighth embodiment, the seventh surface (front surface) F7 of the fourth substrate 40 is bonded to the first surface (front surface) F1 side of the first substrate 10. That is, the fourth substrate 40 is bonded to the first substrate 10 in a face-to-face manner. In this case, the eighth surface (back surface) F8 of the fourth substrate 40 is the light incident surface. The floating diffusion regions FD1 and FD41 are provided on the seventh surface F7 side of the fourth semiconductor layer 44 and are connected to the individual amplification transistors AMP1 and AMP41, respectively. The floating diffusion regions FD2 and FD42 are provided on the seventh surface F7 side of the fourth semiconductor layer 44 and are connected to the individual amplification transistors AMP2 and AMP42, respectively. The amplification transistors AMP1, AMP2, AMP41, AMP42, and other pixel transistors are provided on the third surface F3 of the second substrate 20 as in the third embodiment.

The photodiode PD is formed by introducing impurities from the second surface F2 side of the first substrate. The photodiode PD40 is formed by introducing impurities from the eighth surface F8 side of the fourth substrate 40. Thus, the photodiodes PD and PD4 are largely separated from each other, and can individually operate. Furthermore, the amplification transistors AMP1, AMP41, AMP2, and AMP42 are connected to the floating diffusion regions FD1, FD2, FD41, and FD42, respectively, and output voltages corresponding to respective charges as pixel signals. Therefore, the pixel signal corresponding to each of the photodiodes PD and PD4 can be detected.

The second substrate 20 is bonded to the second surface F2 of the first substrate 10 on the fourth surface F4 side. In addition, the second substrate 20 includes, on the third surface F3 side, not only the pixel transistors corresponding to the photodiode PD but also a pixel transistor that outputs a pixel signal based on the charge output from the photodiode PD40.

Other configurations of the eighth embodiment may be similar to those of the third embodiment. Therefore, the eighth embodiment can also obtain effects similar to those of the third embodiment.

Ninth Embodiment

FIG. 17 is a cross-sectional view depicting a configuration example of the light receiving element 1 according to a ninth embodiment. In the ninth embodiment, the substrate 10 is used as an iTOF, and the substrate 40 is used as a CMOS image sensor (CIS). As described above, one light receiving element of the substrates 10 and 40 may be used as a distance measuring device such as an iTOF, and the other light receiving element may be used as an imaging device such as a CIS. It is only required to provide one transfer transistor TR41 and one floating diffusion region FD41 on the substrate 40 used as the CIS. Thus, the light receiving element 1 can perform both image and distance measurement in the same pixel region.

Tenth Embodiment

FIG. 18 is a cross-sectional view depicting a configuration example of the light receiving element 1 according to a tenth embodiment. In the tenth embodiment, a photoelectric conversion film 60 is provided on the second surface F2 of the first substrate 10. Note that the fourth substrate 40 is not provided. The photoelectric conversion film 60 is a film having a photoelectric conversion function other than silicon. For the photoelectric conversion film 60, for example, an organic photoelectric conversion film, amorphous silicon, a chalcopyrite-based compound, a III-V group compound, or a quantum dot is used. The photoelectric conversion film 60 generates a charge according to incident light. The photoelectric conversion film 60 is electrically connected to the amplification transistor AMP60. The amplification transistor AMP60 amplifies a voltage signal corresponding to the charge generated by the photoelectric conversion film 60 as a pixel signal. The photoelectric conversion film 60 is provided instead of the fourth substrate 40 of another embodiment. Therefore, the photoelectric conversion film 60 can be used as, for example, an imaging device such as a CIS. Thus, the tenth embodiment can obtain both the distance measuring function and the imaging function similarly to the ninth embodiment.

Eleventh Embodiment

FIG. 19 is a cross-sectional view depicting a configuration example of the light receiving element 1 according to an eleventh embodiment. In the eleventh embodiment, the photoelectric conversion film 60 is provided on the eighth surface F8 of the fourth substrate 40. The photoelectric conversion film 60 is a film having a photoelectric conversion function other than silicon. On the other hand, the photoelectric conversion film 60 does not have a charge accumulation function. For the photoelectric conversion film 60, for example, an organic photoelectric conversion film, amorphous silicon, a chalcopyrite-based compound, a III-V group compound, or a quantum dot is used. The photoelectric conversion film 60 generates a charge according to incident light. The photoelectric conversion film 60 is electrically connected to the amplification transistor AMP60. The amplification transistor AMP60 amplifies a voltage signal corresponding to the charge generated by the photoelectric conversion film 60 as a pixel signal. The photoelectric conversion film 60 can be used as an imaging device such as a CIS, for example, in addition to the first substrate 10 and the fourth substrate 40. Thus, in the eleventh embodiment, not only both the distance measuring function and the imaging function can be obtained, but also high resolution image quality can be obtained in the imaging function.

An example of the vehicle control system to which the technology according to an embodiment of the present disclosure can be applied has been described above. The technology according to the present disclosure can be applied to, for example, the imaging section 12031 and the like among the configurations described above.

Note that the present disclosure is not limited to the above-described embodiments, and various modifications can be made without departing from the gist of the present disclosure. Furthermore, the effects described in the present specification are merely examples and are not limited, and other effects may be provided.

Note that the present technology can have the following configurations.

(1)

A photodetection device including:

a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section; and a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section.

(2)

The photodetection device according to (1), in which the first and second voltage application sections distribute charges generated in the first photoelectric conversion section by reflected light from an object irradiated with irradiation light to the first or second charge accumulation section in synchronization with a period of the irradiation light.

(3)

The photodetection device according to (1) or (2), in which the first pixel transistor includes:

a first amplification transistor that generates, as the pixel signal, a voltage signal corresponding to a charge retained in the first charge accumulation section;

a second amplification transistor that generates, as the pixel signal, a voltage signal corresponding to a charge retained in the second charge accumulation section;

a first selection transistor that controls an output timing of the pixel signal from the first amplification transistor;

a second selection transistor that controls an output timing of the pixel signal from the second amplification transistor;

a first reset transistor that discharges the charge in the first charge accumulation section; and a second reset transistor that discharges the charge in the second charge accumulation section.

(4)

The photodetection device according to any one of (1) to (3), in which the first substrate includes:

a first transfer transistor that includes a gate electrode as the first voltage application section and transfers the charge generated by the first photoelectric conversion section to the first charge accumulation section; and a second transfer transistor that includes a gate electrode as the second voltage application section and transfers the charge generated by the first photoelectric conversion section to the second charge accumulation section.

(5)

The photodetection device according to any one of (1) to (3), in which the first charge accumulation section is provided around the first voltage application section, the second charge accumulation section is provided around the second voltage application section, the first and second voltage application sections are impurity layers of a first conductivity type, and the first and second charge accumulation sections are impurity layers of a second conductivity type.

(6)

The photodetection device according to any one of (1) to (5), in which the first pixel transistor is provided on the third surface of the second semiconductor layer, and the second substrate is bonded to the first surface of the first substrate on the side of the fourth surface.

(7)

The photodetection device according to any one of (1) to (6), in which any material of silicon (Si), germanium (Ge), silicon-germanium (SiGe), and indium gallium arsenide (InGaAs) is used for the first and second semiconductor layers.

(8)

The photodetection device according to any one of (1) to (7), further including an electrode plug provided between the first substrate and the second substrate.

(9)

The photodetection device according to any one of (1) to (8), further including a third substrate bonded to the second substrate and including a logic circuit that processes the pixel signal.

(10)

The photodetection device according to any one of (1) to (9), in which the first substrate further includes a third charge accumulation section provided on the side of the first surface of the first semiconductor layer, and a third voltage application section that applies a voltage to the first semiconductor layer between the third charge accumulation section and the first photoelectric conversion section.

(11)

The photodetection device according to any one of (1) to (10), in which the first substrate further includes a charge discharge transistor that discharges the charge accumulated in the first photoelectric conversion section.

(12)

The photodetection device according to any one of (1) to (11), in which the first substrate further includes first and second memories connected to the first and second charge holding sections, respectively, and capable of storing charges separately from the first and second charge holding units.

(13)

The photodetection device according to (10), in which the first substrate further includes a fourth charge accumulation section provided on the side of the first surface of the first semiconductor layer, and a fourth voltage application section that applies a voltage to the first semiconductor layer between the fourth charge accumulation section and the first photoelectric conversion section.

(14)

An electronic device including a photodetection device that includes:

a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section; and a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section.

(15)

The photodetection device according to any one of (1) to (13), further including a fourth substrate including a fourth semiconductor layer that includes a seventh surface and an eighth surface on a side opposite to the seventh surface and on a light incident side and is provided on the side of the second surface, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section.

(16)

The photodetection device according to (15), in which at least a part of the first pixel transistor is shared by the first and second photoelectric conversion sections.

(17)

The photodetection device according to (16), in which a second amplification transistor that outputs a voltage corresponding to a potential of the second photoelectric conversion section is provided separately from a first amplification transistor that outputs a voltage corresponding to a potential of the first photoelectric conversion section among the first pixel transistors.

(18)

The photodetection device according to (15), further including a fifth substrate provided between the first substrate and the fourth substrate and including a second pixel transistor that outputs a pixel signal based on a charge output from the second photoelectric conversion section.

(19)

The photodetection device according to any one of (1) to (13), further including a fourth substrate including a fourth semiconductor layer that includes a seventh surface on a light incident side and an eighth surface on a side opposite to the seventh surface, the eighth surface being bonded to the side of the second surface, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section.

(20)

The photodetection device according to (19), further including a fifth substrate provided on a side of the seventh surface of the fourth substrate and including a second pixel transistor that outputs a pixel signal based on a charge output from the second photoelectric conversion section.

(21)

The photodetection device according to any one of (1) to (13), further including a fourth substrate including a fourth semiconductor layer that includes an eighth surface on a light incident side and a seventh surface on a side opposite to the eighth surface, the seventh surface being bonded to the side of the first surface of the first substrate, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section, in which the second substrate is bonded to the second surface of the first substrate on the side of the fourth surface, and includes, on the third surface, a second pixel transistor that outputs a pixel signal based on a charge output from the second photoelectric conversion section.

(22)

The photodetection device according to any one of (15) to (21), in which one of the pixel signals from the first and fourth substrates is used for distance measurement, and the other is used for obtaining an image.

(23)

The photodetection device according to any one of (1) to (14), further including a photoelectric conversion film provided on the second surface of the first substrate.

(24)

The photodetection device according to any one of (15) to (22), further including a photoelectric conversion film provided on the eighth surface of the fourth substrate.

REFERENCE SIGNS LIST

12 Pixel
PD Photodiode
TR1, TR2 Transfer section
FD1, FD2 Floating diffusion region
FDL1, FDL2 Additional capacitor
FDG1, FDG2 Switching transistor
AMP1, AMP2 Amplification transistor
RST1, RST2 Reset transistor
SEL1, SEL2 Selection transistor
1 Light receiving element
10 First substrate
20 Second substrate
30 Third substrate
22 Readout circuit
32 Logic circuit

The invention claimed is:

1. A photodetection device, comprising:

a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section; and a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section, wherein the first and second voltage application sections distribute charges generated in the first photoelectric conversion section by reflected light from an object irradiated with irradiation light to the first or second charge accumulation section in synchronization with a period of the irradiation light.

2. The photodetection device according to claim 1, wherein the first pixel transistor is provided on the third surface of the second semiconductor layer, and the second substrate is bonded to the first surface of the first substrate on the side of the fourth surface.

3. The photodetection device according to claim 1, wherein any material of silicon (Si), germanium (Ge), silicon-germanium (SiGe), and indium gallium arsenide (InGaAs) is used for the first and second semiconductor layers.

4. The photodetection device according to claim 1, further comprising an electrode plug provided between the first substrate and the second substrate.

5. The photodetection device according to claim 1, further comprising a third substrate bonded to the second substrate and including a logic circuit that processes the pixel signal.

6. The photodetection device according to claim 1, wherein the first substrate further includes a third charge accumulation section provided on the side of the first surface of the first semiconductor layer, and a third voltage application section that applies a voltage to the first semiconductor layer between the third charge accumulation section and the first photoelectric conversion section.

7. The photodetection device according to claim 1, wherein the first substrate further includes a charge discharge transistor that discharges the charge accumulated in the first photoelectric conversion section.

8. The photodetection device according to claim 1, wherein the first substrate further includes first and second memories connected to the first and second charge accumulation sections, respectively, and capable of storing charges separately from the first and second charge accumulation sections.

9. The photodetection device according to claim 6, wherein the first substrate further includes a fourth charge accumulation section provided on the side of the first surface of the first semiconductor layer, and a fourth voltage application section that applies a voltage to the first semiconductor layer between the fourth charge accumulation section and the first photoelectric conversion section.

10. The photodetection device according to claim 1, further comprising a fourth substrate including a fourth semiconductor layer that includes a seventh surface on a light incident side and an eighth surface on a side opposite to the seventh surface, the eighth surface being bonded to the side of the second surface, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section.

11. The photodetection device according to claim 10, further comprising a fifth substrate provided on a side of the seventh surface of the fourth substrate and including a second pixel transistor that outputs a pixel signal based on a charge output from the second photoelectric conversion section.

12. The photodetection device according to claim 1, further comprising a fourth substrate including a fourth semiconductor layer that includes an eighth surface on a light incident side and a seventh surface on a side opposite to the eighth surface, the seventh surface being bonded to the side of the first surface of the first substrate, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section, wherein the second substrate is bonded to the second surface of the first substrate on the side of the fourth surface, and includes, on the third surface, a second pixel transistor that outputs a pixel signal based on a charge output from the second photoelectric conversion section.

13. The photodetection device according to claim 1, further comprising a photoelectric conversion film provided on the second surface of the first substrate.

14. The photodetection device according to claim 1, wherein the first pixel transistor includes:

a first amplification transistor that generates, as the pixel signal, a voltage signal corresponding to a charge retained in the first charge accumulation section;

a second amplification transistor that generates, as the pixel signal, a voltage signal corresponding to a charge retained in the second charge accumulation section;

a first selection transistor that controls an output timing of the pixel signal from the first amplification transistor;

a second selection transistor that controls an output timing of the pixel signal from the second amplification transistor;

a first reset transistor that discharges the charge in the first charge accumulation section; and a second reset transistor that discharges the charge in the second charge accumulation section.

15. The photodetection device according to claim 1, wherein the first substrate includes:

a first transfer transistor that includes a gate electrode as the first voltage application section and transfers the charge generated by the first photoelectric conversion section to the first charge accumulation section; and a second transfer transistor that includes a gate electrode as the second voltage application section and transfers the charge generated by the first photoelectric conversion section to the second charge accumulation section.

16. A photodetection device, comprising:

a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section; and a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section, wherein the first pixel transistor includes:

a first amplification transistor that generates, as the pixel signal, a voltage signal corresponding to a charge retained in the first charge accumulation section;

a second amplification transistor that generates, as the pixel signal, a voltage signal corresponding to a charge retained in the second charge accumulation section;

a first selection transistor that controls an output timing of the pixel signal from the first amplification transistor;

a second selection transistor that controls an output timing of the pixel signal from the second amplification transistor;

a first reset transistor that discharges the charge in the first charge accumulation section; and a second reset transistor that discharges the charge in the second charge accumulation section.

17. A photodetection device, comprising:

a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section; and a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section, wherein the first substrate includes:

a first transfer transistor that includes a gate electrode as the first voltage application section and transfers the charge generated by the first photoelectric conversion section to the first charge accumulation section; and a second transfer transistor that includes a gate electrode as the second voltage application section and transfers the charge generated by the first photoelectric conversion section to the second charge accumulation section.

18. A photodetection device, comprising:

a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section; and a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section, wherein the first charge accumulation section is provided around the first voltage application section, the second charge accumulation section is provided around the second voltage application section, the first and second voltage application sections are impurity layers of a first conductivity type, and the first and second charge accumulation sections are impurity layers of a second conductivity type.

19. A photodetection device, comprising:

a first substrate including a first semiconductor layer that includes a first surface and a second surface on a side opposite to the first surface, first and second charge accumulation sections provided on a side of the first surface of the first semiconductor layer, a first photoelectric conversion section provided in the first semiconductor layer, and first and second voltage application sections that apply a voltage to the first semiconductor layer between the first and second charge accumulation sections and the first photoelectric conversion section;

a second substrate including a second semiconductor layer that includes a third surface and a fourth surface on a side opposite to the third surface and is bonded to the first substrate on a side of the third or fourth surface, and a first pixel transistor that is provided on the third or fourth surface and outputs a pixel signal based on a charge output from the first photoelectric conversion section; and a fourth substrate including a fourth semiconductor layer that includes a seventh surface and an eighth surface on a side opposite to the seventh surface and on a light incident side and is provided on the side of the second surface, fifth and sixth charge accumulation sections provided on a side of the seventh surface of the fourth semiconductor layer, a second photoelectric conversion section provided in the fourth semiconductor layer, and fifth and sixth voltage application sections that apply a voltage to the fourth semiconductor layer between the fifth and sixth charge accumulation sections and the second photoelectric conversion section.

20. The photodetection device according to claim 19, wherein at least a part of the first pixel transistor is shared by the first and second photoelectric conversion sections.

21. The photodetection device according to claim 20, wherein a second amplification transistor that outputs a voltage corresponding to a potential of the second photoelectric conversion section is provided separately from a first amplification transistor that outputs a voltage corresponding to a potential of the first photoelectric conversion section among the first pixel transistors.

22. The photodetection device according to claim 19, further comprising a fifth substrate provided between the first substrate and the fourth substrate and including a second pixel transistor that outputs a pixel signal based on a charge output from the second photoelectric conversion section.

23. The photodetection device according to claim 19, wherein one of the pixel signals from the first and fourth substrates is used for distance measurement, and the other is used for obtaining an image.

24. The photodetection device according to claim 19, further comprising a photoelectric conversion film provided on the eighth surface of the fourth substrate.

* * * * *